(12) United States Patent
Nawano et al.

(10) Patent No.: US 8,573,754 B2
(45) Date of Patent: Nov. 5, 2013

(54) METHODS FOR MANUFACTURING LIQUID EJECTING HEAD AND PIEZOELECTRIC ELEMENT, LIQUID EJECTING HEAD, LIQUID EJECTING APPARATUS, AND PIEZOELECTRIC ELEMENT

(75) Inventors: Masahisa Nawano, Suwa (JP);
Takayuki Yonemura, Suwa (JP);
Tomokazu Kobayashi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/983,833

(22) Filed: Jan. 3, 2011

(65) Prior Publication Data

US 2011/0164095 A1    Jul. 7, 2011

(30) Foreign Application Priority Data

Jan. 5, 2010    (JP) .................. 2010-000828

(51) Int. Cl.
*B41J 2/045*    (2006.01)
*H01L 41/047*    (2006.01)

(52) U.S. Cl.
USPC ............................................. 347/71; 310/364

(58) Field of Classification Search
CPC .................... B41J 2/14233; H01L 41/0973
USPC .................. 347/71; 310/365; 29/25.35, 890.1
See application file for complete search history.

(56) References Cited

U.S. PATENT DOCUMENTS

| | | | |
|---|---|---|---|
| 5,350,721 A | 9/1994 | Abe et al. | |
| 5,453,262 A | 9/1995 | Dawson et al. | |
| 6,844,659 B2 | 1/2005 | Ikeda et al. | |
| 6,969,157 B2 | 11/2005 | Tomozawa et al. | |
| 7,498,725 B2 | 3/2009 | Iezumi et al. | |
| 7,589,450 B2 | 9/2009 | Takabe et al. | |
| 2005/0224851 A1 | 10/2005 | Nakazawa | |
| 2006/0170736 A1 | 8/2006 | Tomozawa et al. | |
| 2008/0265718 A1 | 10/2008 | Sakashita et al. | |
| 2008/0278038 A1 | 11/2008 | Kobayashi et al. | |
| 2008/0302658 A1 | 12/2008 | Sasaki et al. | |
| 2009/0230211 A1 | 9/2009 | Kobayashi et al. | |
| 2009/0243438 A1 | 10/2009 | Hamada et al. | |
| 2009/0273651 A1 | 11/2009 | Kazama et al. | |
| 2010/0214372 A1* | 8/2010 | Takabe ......................... | 347/71 |
| 2011/0006243 A1 | 1/2011 | Sasaki et al. | |

(Continued)

FOREIGN PATENT DOCUMENTS

CN    1461703 A    12/2003
CN    101190846 A    6/2008

(Continued)

OTHER PUBLICATIONS

Machine Translation of JP2009113419A.*

(Continued)

*Primary Examiner* — Lisa M Solomon
(74) *Attorney, Agent, or Firm* — Kilpatrick Townsend & Stockton LLP

(57) ABSTRACT

A method for manufacturing a piezoelectric element comprising forming a titanium film containing titanium; forming a platinum film containing platinum on the titanium film; forming a piezoelectric precursor film containing bismuth, lanthanum, iron and manganese on the platinum film; crystallizing the piezoelectric precursor film to form a piezoelectric layer by firing the piezoelectric precursor film in an atmosphere of an inert gas; and forming an electrode on the piezoelectric layer.

9 Claims, 27 Drawing Sheets

(56) References Cited

U.S. PATENT DOCUMENTS

| | | |
|---|---|---|
| 2011/0102514 A1 | 5/2011 | Yonemura |
| 2011/0102517 A1* | 5/2011 | Yonemura et al. .............. 347/71 |
| 2011/0102518 A1 | 5/2011 | Yonemura et al. |
| 2011/0109704 A1 | 5/2011 | Furuya et al. |
| 2011/0164095 A1 | 7/2011 | Nawano et al. |
| 2011/0164096 A1 | 7/2011 | Nawano |
| 2011/0164097 A1 | 7/2011 | Nawano et al. |
| 2011/0164098 A1 | 7/2011 | Kobayashi et al. |
| 2011/0216135 A1 | 9/2011 | Yonemura |
| 2011/0221833 A1 | 9/2011 | Yonemura et al. |

FOREIGN PATENT DOCUMENTS

| | | |
|---|---|---|
| EP | 1 741 557 A2 | 1/2007 |
| EP | 2145975 A2 | 1/2010 |
| JP | 2001-223404 A | 8/2001 |
| JP | 2007287744 A * | 11/2007 |
| JP | 2009-070926 A | 4/2009 |
| JP | 2009-071144 A | 4/2009 |
| JP | 2009113419 A * | 5/2009 |
| JP | 2009-231482 A | 10/2009 |
| JP | 2009-242229 A | 10/2009 |
| JP | 2009-252789 A | 10/2009 |
| JP | 2009-252790 A | 10/2009 |
| JP | 2010-016010 A | 1/2010 |
| JP | 2010-016011 A | 1/2010 |
| JP | 2010-067756 A | 3/2010 |
| JP | 2010-080733 A | 4/2010 |

OTHER PUBLICATIONS

Zhang, Shan-Tao, Preparation, structures, and multiferroic properties of single phase Bi1 -xLaxFeO3 (x=0-0.40) ceramics, J. Appl. Phys. 100, 114108 (2006), Paragraph 1.

Singh. S.K., Room temperature ferroelectric properties of Mn-substituted BiFeO3 thin films deposited on Pt electrodes using chemical solution deposition, Appl. Phys. Lett. 88, 262908 (2006), Paragraphs 3-4.

EESR mailed on Jun. 20, 2011 in European Patent Application No. 11157439.8, for Seiko Epson Corporation.

Wu, Jiagang, and John Wang. "Effects of SrRuO3 buffer layer thickness on mulitiferroic (Bi0.90La0.10)(Fe0.95Mn0.05)O3 thin films." *Journal of Applied Physics* 106.5 (2009): 054115.

* cited by examiner

METHODS FOR MANUFACTURING LIQUID EJECTING HEAD AND PIEZOELECTRIC ELEMENT, LIQUID EJECTING HEAD, LIQUID EJECTING APPARATUS, AND PIEZOELECTRIC ELEMENT

CROSS-REFERENCE TO RELATED APPLICATIONS

This application claims the benefit of priority to Japanese Patent Application No. 2010-000828 filed Jan. 5, 2010, the contents of which are hereby incorporated by reference in their entirety.

BACKGROUND

1. Technical Field

The present invention relates to a method for manufacturing a liquid ejecting head that includes a pressure generating chamber communicating with a nozzle aperture, and a piezoelectric element changing the pressure in the pressure generating chamber and including a piezoelectric layer and electrodes applying a voltage to the piezoelectric layer. The invention also relates to a liquid ejecting head and a liquid ejecting apparatus.

2. Related Art

Some of the piezoelectric elements used in liquid ejecting heads have a structure in which a piezoelectric layer made of a piezoelectric material capable of electromechanical conversion, such as a crystallized dielectric material, is disposed between two electrodes. This type of piezoelectric element can be used as a deflection vibration mode actuator device in a liquid ejecting head. Ink jet recording heads are a typical type of liquid ejecting head. An ink jet recording head includes a vibration plate defining a part of a pressure generating chamber communicating with a nozzle aperture through which ink droplets are ejected. In the ink jet recording head, a piezoelectric element deforms the vibration plate to apply a pressure to the ink in the pressure generating chamber, thereby ejecting ink droplets through the nozzle aperture. In some cases, a plurality of piezoelectric elements are provided for respective pressure generating chambers by dividing a uniform piezoelectric material layer formed over the entire surface of a vibration plate into shapes corresponding to the pressure generating chambers by photolithography.

The piezoelectric element can be made of lead zirconate titanate (PZT), as disclosed in, for example, JP-A-2001-223404.

On the other hand, piezoelectric materials containing lead-free ferroelectrics are desired from the viewpoint of environmental protection. An example of the lead-free piezoelectric material is $BiFeO_3$ having a perovskite structure expressed by $ABO_3$. However, for example, $BiFeO_3$-based piezoelectric materials are less insulating and can cause leakage current. This problem can arise not only in liquid ejecting heads represented by an ink jet recording head, but also in piezoelectric elements such as actuator devices used in other apparatuses.

SUMMARY

An advantage of some aspects of the invention is that it provides a method for manufacturing a liquid ejecting head including a lead-free piezoelectric element having so high an insulation property as to reduce leakage current, and a liquid ejecting head and a liquid ejecting apparatus.

According to an aspect of the invention, a method is provided for manufacturing a liquid ejecting head including a pressure generating chamber communicating with a nozzle aperture, and a piezoelectric element changing the pressure in the pressure generating chamber. In the method, a titanium film is formed. A platinum film is formed on the titanium film. A piezoelectric precursor film containing bismuth, lanthanum, iron and manganese is formed on the platinum film. The piezoelectric precursor film is crystallized to form a piezoelectric layer by firing the piezoelectric precursor film in an inert gas atmosphere. An electrode is formed on the piezoelectric layer.

This method can provide a liquid ejecting head including a lead-free piezoelectric element having so high an insulation property as to reduce leakage current. Also, the piezoelectric layer can be highly distorted, and whose crystals can be preferentially oriented in the (100) plane.

Preferably, the inert gas is nitrogen. By performing crystallization in a nitrogen atmosphere, the resulting liquid ejecting head can include a lead-free piezoelectric element having so high an insulation property as to reduce leakage current.

According to another aspect, a liquid ejecting apparatus is provided which includes a liquid ejecting head manufactured by the above method. Since the liquid ejecting head of the liquid ejecting apparatus includes a lead-free piezoelectric element having so high an insulation property as to reduce leakage current, the apparatus does not adversely affect the environment and is so reliable as to prevent dielectric breakdown.

A method for manufacturing a piezoelectric element is also provided. In this method, a titanium film is formed. A platinum film is formed on the titanium film. A piezoelectric precursor film containing bismuth, lanthanum, iron and manganese is formed on the platinum film. The piezoelectric precursor film is crystallized to form a piezoelectric layer by firing the piezoelectric precursor film in an inert gas atmosphere. An electrode is formed on the piezoelectric layer. This method can provide a lead-free piezoelectric element having so high an insulation property as to reduce leakage current.

According to another aspect, a liquid ejecting head is provided which includes a pressure generating chamber communicating with a nozzle aperture, and a piezoelectric element changing the pressure in the pressure generating chamber. The piezoelectric element includes a first electrode, a piezoelectric layer containing bismuth lanthanum ferrate manganate, and a second electrode disposed on the piezoelectric layer. The first electrode includes a first titanium oxide layer containing titanium oxide, a platinum layer containing platinum disposed on the first titanium oxide layer, a second titanium oxide layer containing titanium oxide disposed on the platinum layer. The piezoelectric layer is disposed on the second titanium oxide. The structure including a titanium oxide layer, a platinum layer, a titanium oxide layer, a piezoelectric layer containing bismuth lanthanum ferrate manganate and an electrode in that order can achieve a liquid ejecting head including a lead-free piezoelectric element having so high an insulation property as to reduce leakage current.

Preferably, the piezoelectric layer contains a complex oxide expressed by general formula (1):

$$(Bi_{1-x}, La_x)(Fe_{1-y}, Mn_y)O_3 \qquad (1)$$

where $0.10 \leq x \leq 0.20$ and $0.01 \leq y \leq 0.09$

Since $ABO_3$-type complex oxides expressed by general formula (1) can exhibit ferroelectric characteristics, the liquid ejecting head can include a lead-free piezoelectric element allowing easy control of the distortion. The piezoelectric element can easily control the size of droplets ejected.

Preferably, the piezoelectric layer exhibits a powder X-ray diffraction pattern measured at $\phi=\psi=0°$ in which the area intensity of the peak derived from $ABO_3$ structures observed in $20°<2\theta<25°$ is at least 90% that of the total area intensity of peaks derived from $ABO_3$ structures observed in $20°<2\theta<50°$. Such a piezoelectric layer provides superior piezoelectric characteristics.

According to another aspect of the invention, a liquid ejection apparatus including the above-described liquid ejection head is provided. Since the liquid ejecting head of the liquid ejecting apparatus includes a lead-free piezoelectric element having so high an insulation property as to reduce leakage current, the apparatus does not adversely affect the environment and is so reliable as to prevent dielectric breakdown.

A piezoelectric element also provided which includes a first electrode, a piezoelectric layer containing bismuth lanthanum ferrate manganate, and a second electrode disposed on the piezoelectric layer. The first electrode includes a first titanium oxide layer containing titanium oxide, a platinum layer containing platinum disposed on the first titanium oxide, and a second titanium oxide layer containing titanium oxide disposed on the platinum layer. The piezoelectric layer is disposed on the second titanium oxide layer. This structure can provide a lead-free piezoelectric element having so high an insulation property as to reduce leakage current.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
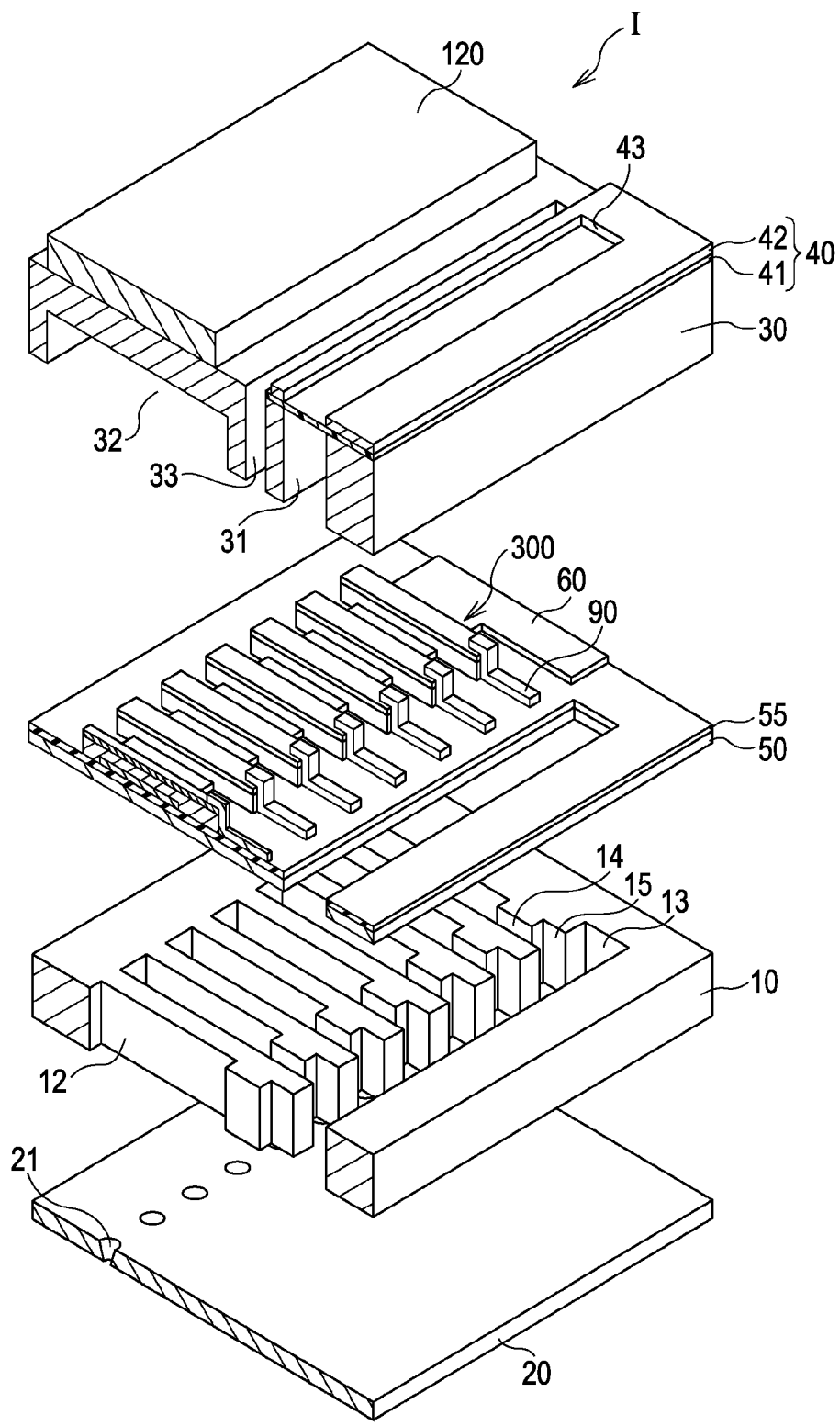
FIG. 1 is a schematic exploded perspective view of a recording head according to an embodiment of the invention.
Figure 2:
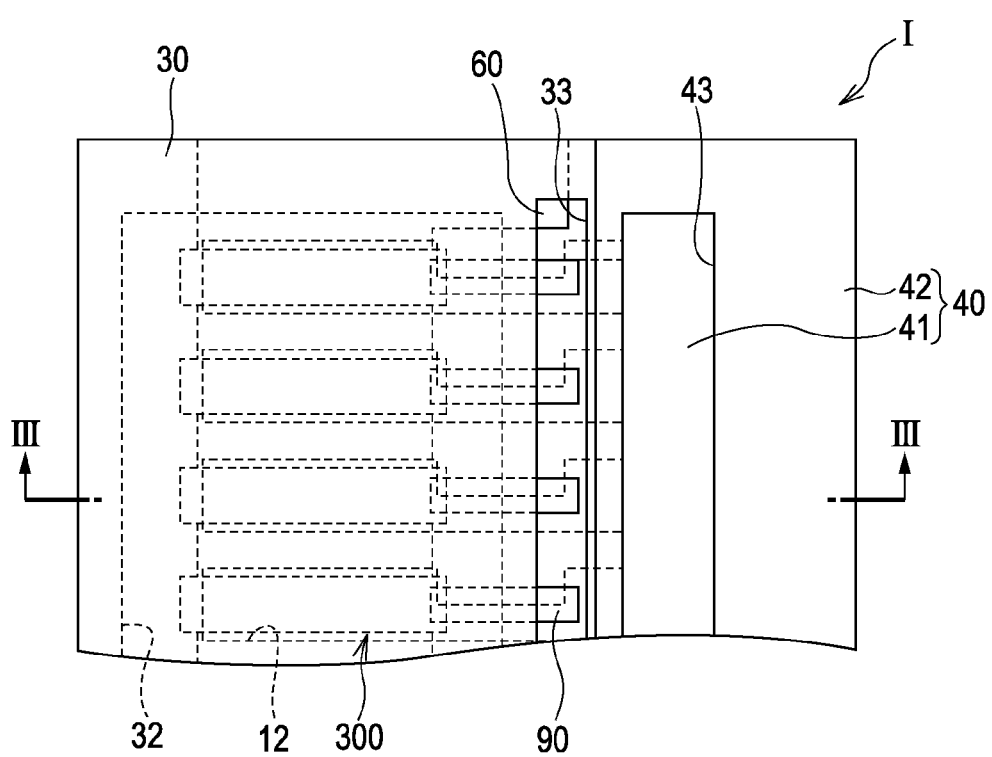
FIG. 2 is a plan view of the recording head according to the embodiment.
Figure 3A:
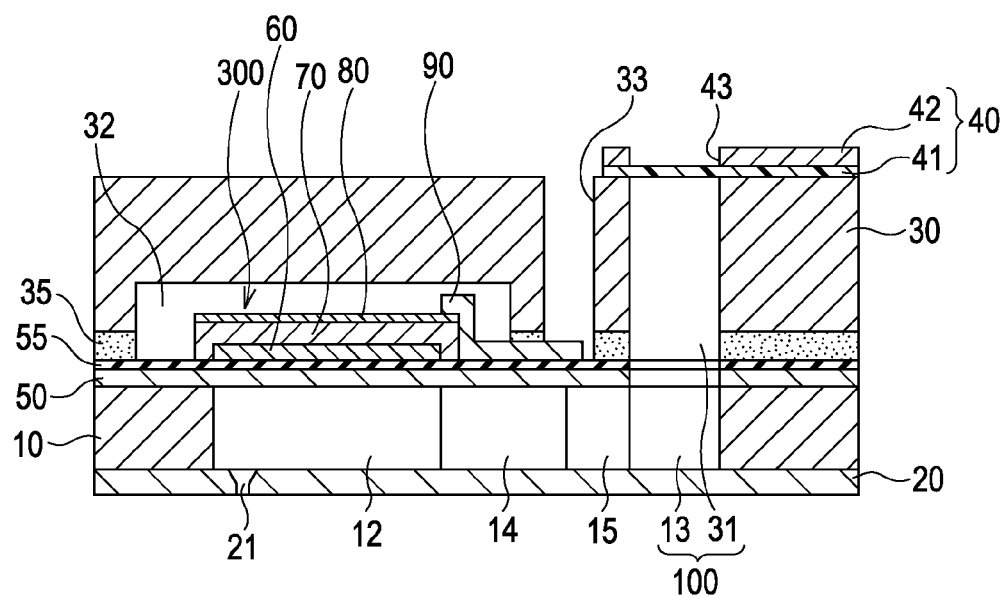
FIG. 3A is a sectional view of the recording head according to the embodiment.
Figure 3B:
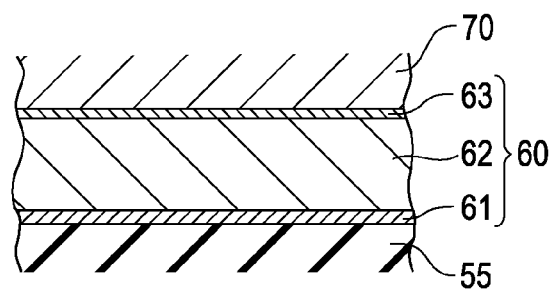
FIG. 3B is a fragmentary enlarged sectional view of a main portion of the recording head shown in FIG. 3A.
Figure 4:
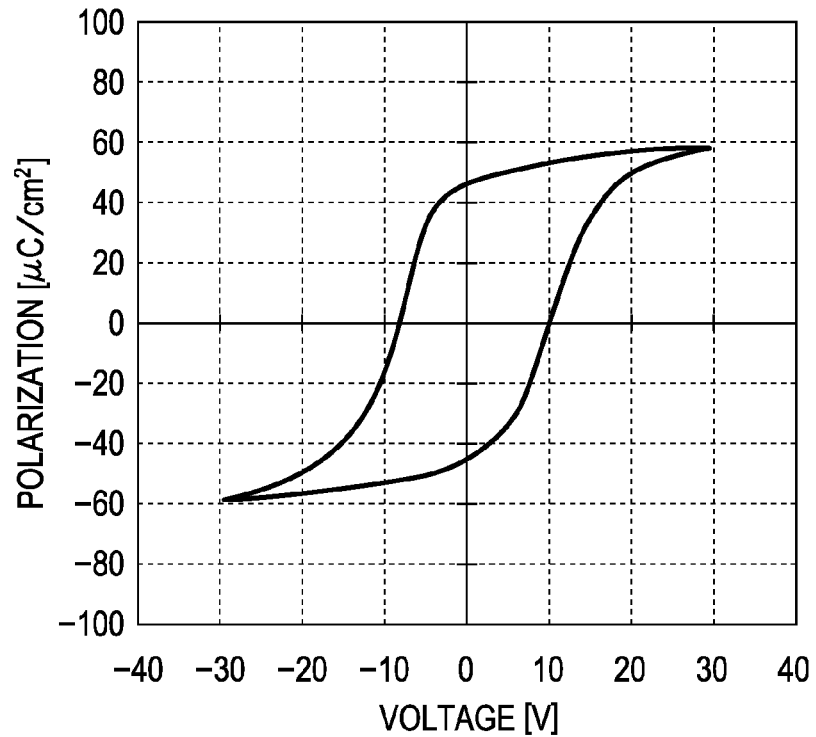
FIG. 4 is a P-V curve of Sample 1.
Figure 5:
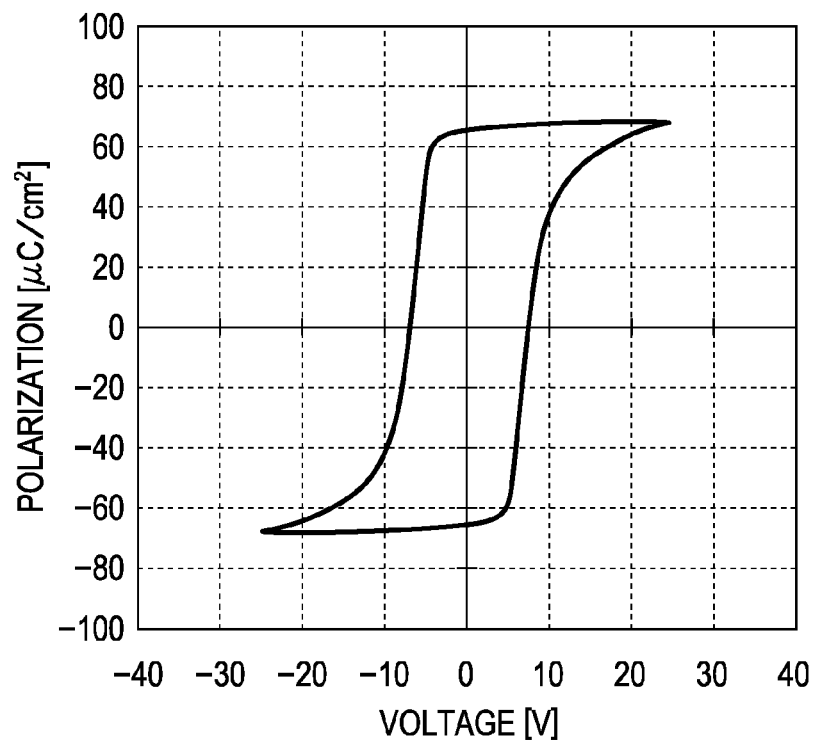
FIG. 5 is a P-V curve of Sample 2.
Figure 6:
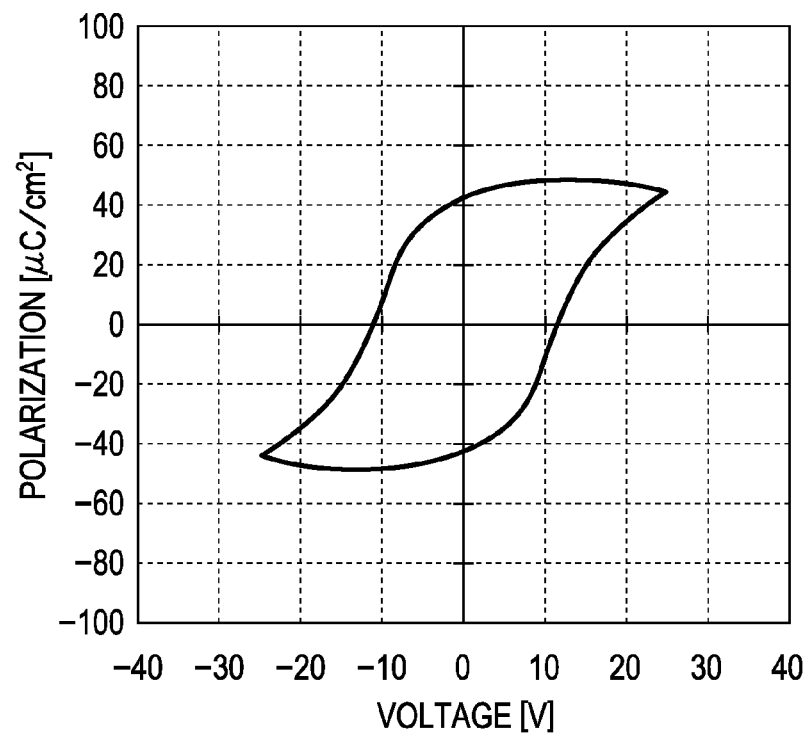
FIG. 6 is a P-V curve of Sample 3.
Figure 7:
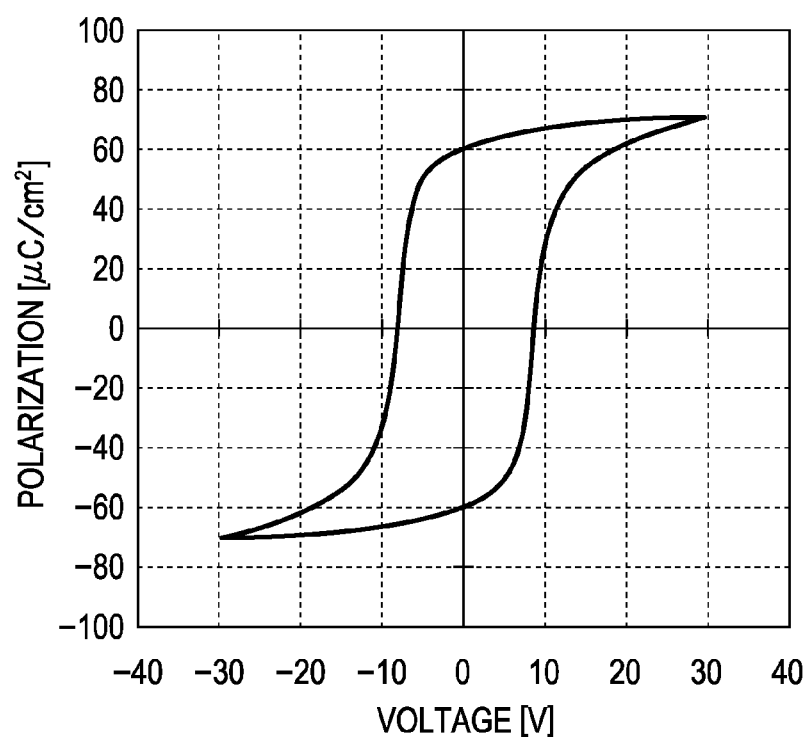
FIG. 7 is a P-V curve of Sample 4.
Figure 8:
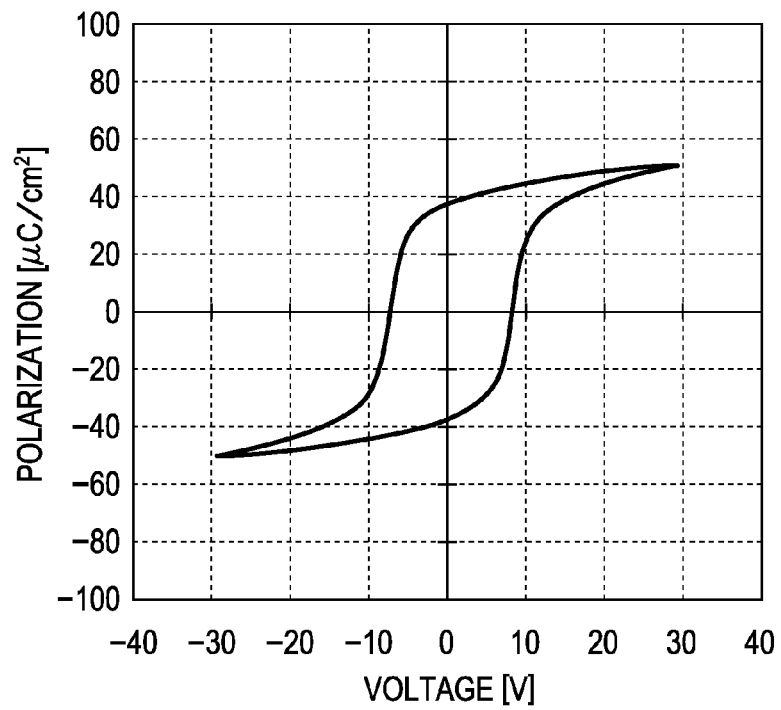
FIG. 8 is a P-V curve of Sample 5.
Figure 9:
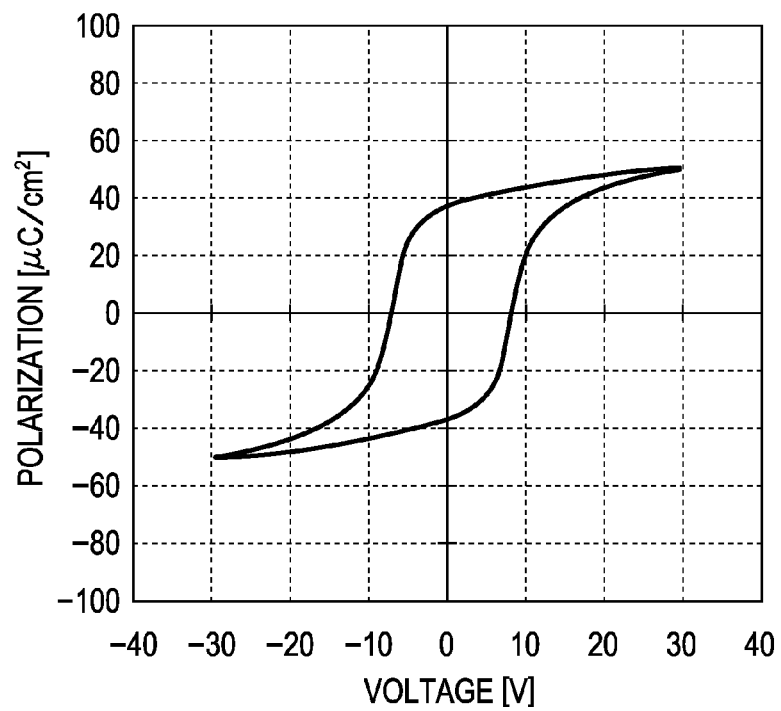
FIG. 9 is a P-V curve of Sample 6.
Figure 10:
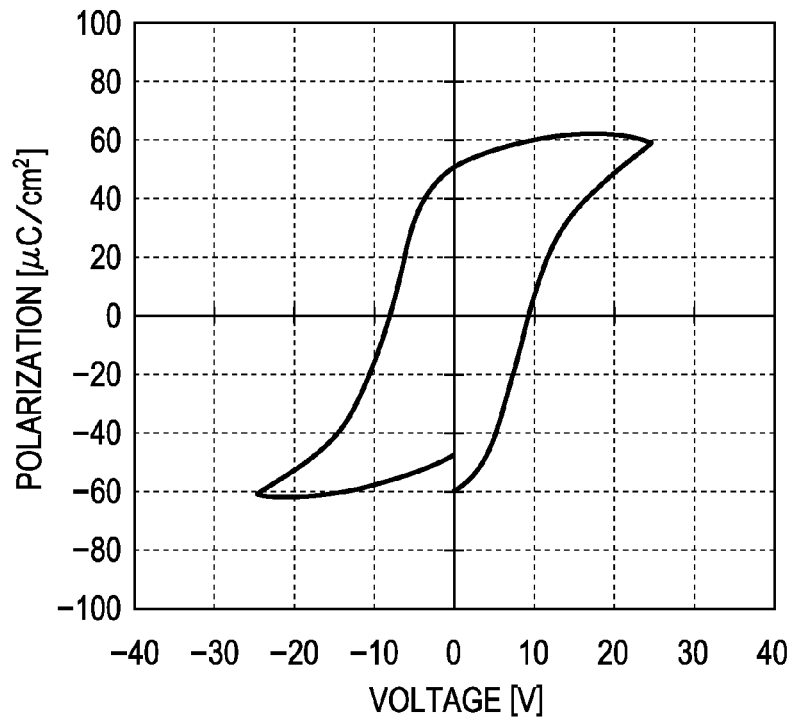
FIG. 10 is a P-V curve of Sample 7.
Figure 11:
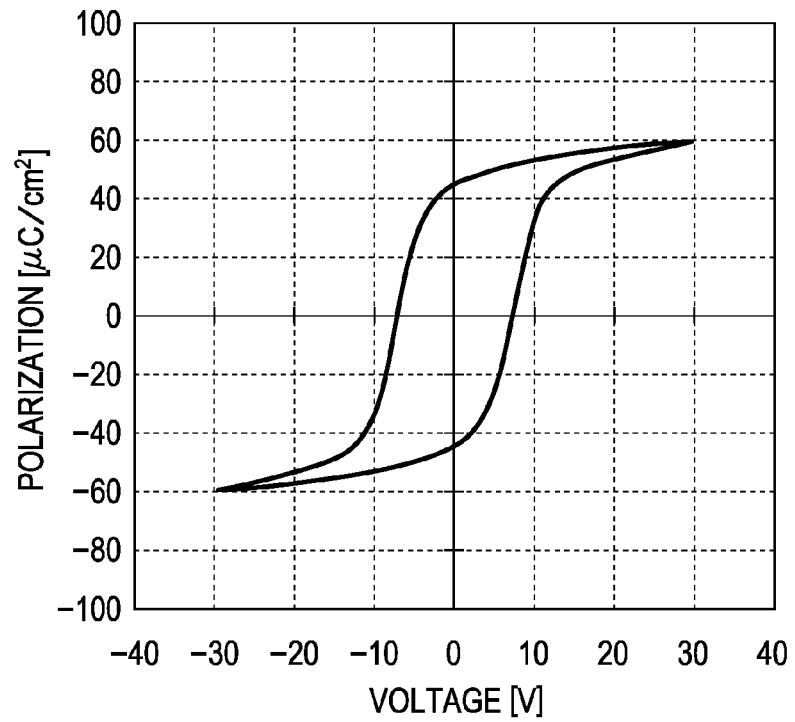
FIG. 11 is a P-V curve of Sample 8.
Figure 12:
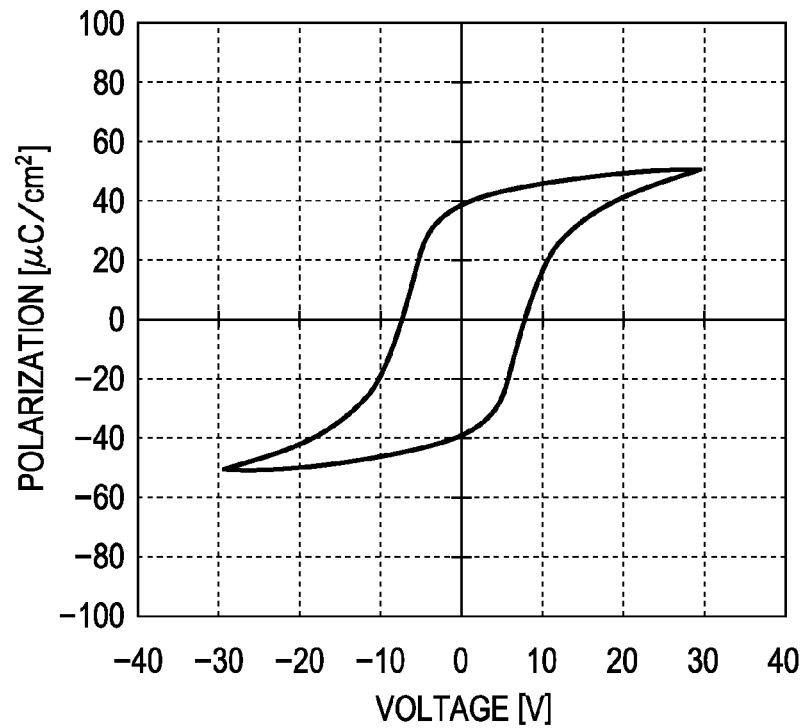
FIG. 12 is a P-V curve of Sample 9.
Figure 13:
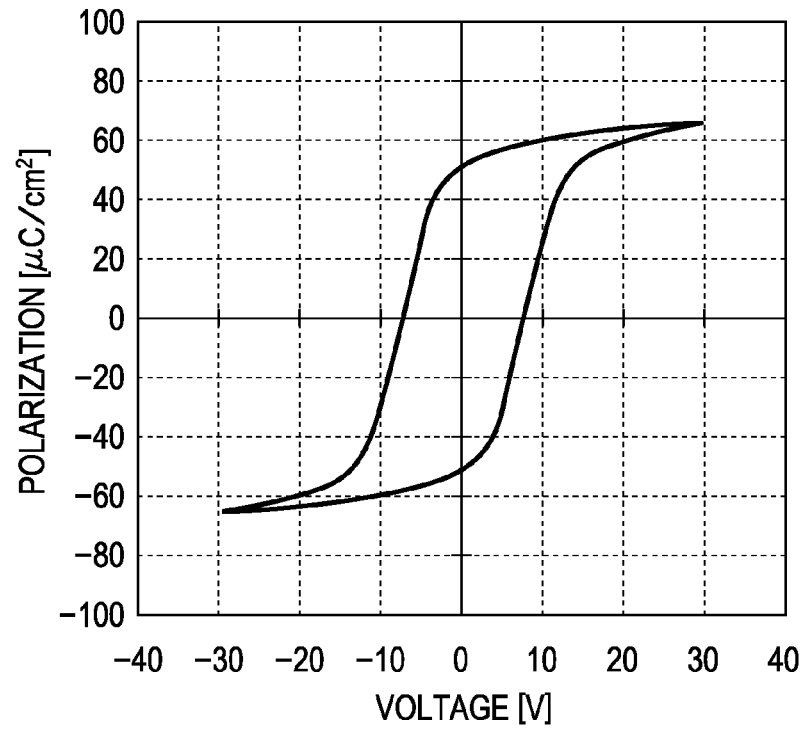
FIG. 13 is a P-V curve of Sample 10.
Figure 14:
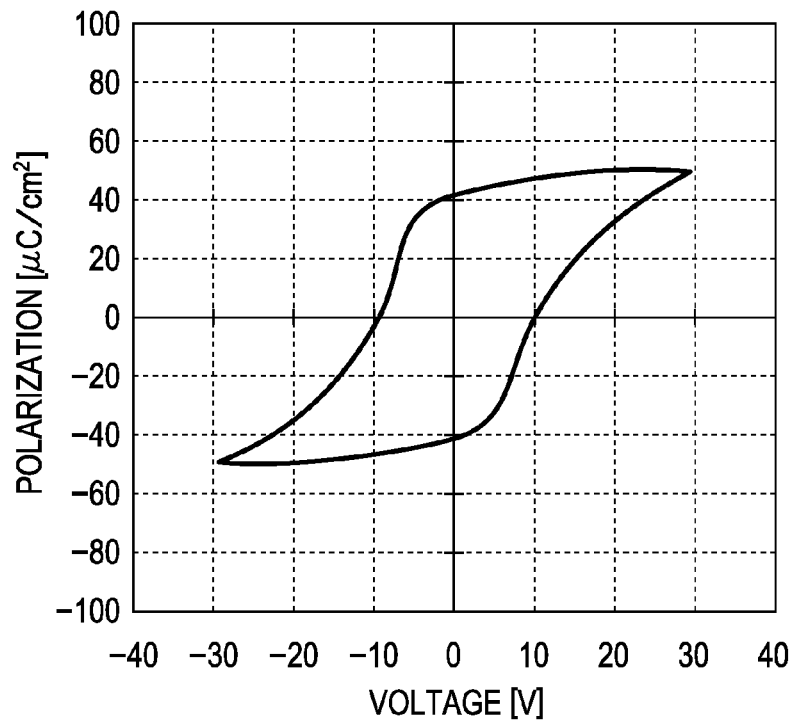
FIG. 14 is a P-V curve of Sample 11.

FIG. 1 is a schematic exploded perspective view of an ink jet recording head that is a type of liquid ejecting head manufactured by a method according to an embodiment of the invention. FIG. 2 is a plan view of the ink jet recording head shown in FIG. 1. FIG. 3A is a sectional view taken along line III-III in FIG. 2, and FIG. 3B is an enlarged view of a main part of FIG. 3A.

A flow channel substrate 10 is made of monocrystalline silicon, and a silicon dioxide elastic film 50 is formed on one surface of the flow channel substrate 10, as shown in FIGS. 1 to 3.

The flow channel substrate 10 has a plurality of pressure generating chambers 12 arranged in parallel in the direction of their widths. The flow channel substrate 10 also has a communicating section 13 therein in a region to the outside of the pressure generating chambers 12 in their longitudinal direction. The communicating section 13 communicates with the pressure generating chambers 12 through their respective ink supply channels 14 and communication paths 15. The communicating section 13 communicates with a reservoir section 31 formed in a protective substrate (described later) to define part of a reservoir acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side, in the present embodiment, the flow channels may be narrowed from both sides. Alternatively, the ink supply channels 14 may be formed by reducing the depth of the flow channels, instead of narrowing the flow channels. In the present embodiment, the flow channel substrate 10 has liquid flow channels including the pressure generating chambers 12, the communicating section 13, the ink supply channels 14 and the communication paths 15.

The flow channel substrate 10 is joined with a nozzle plate 20 at the open side thereof with an adhesive, thermal fusion film or the like. The nozzle plate 20 has nozzle apertures 21 communicating with end portions of the respective pressure generating chambers 12 opposite to the ink supply channels 14. The nozzle plate 20 can be made of, for example, glass-ceramic, monocrystalline silicon or stainless steel.

On the other hand, an elastic film 50 is formed over the other side, opposite to the open side, of the flow channel substrate 10, and an insulating film 55 is formed of, for example, zirconium oxide on the elastic film 50.

Furthermore, piezoelectric elements 300 are formed on the insulating film 55. Each piezoelectric element 300 includes a first electrode 60, a piezoelectric layer 70 having a small thickness of 2 μm or less, preferably 0.3 to 1.5 μm, and a second electrode 80. The piezoelectric element 300 mentioned herein refers to the portion including the first electrode 60, the piezoelectric layer 70 and the second electrode 80. In general, either electrode of the piezoelectric element 300 acts as a common electrode, and the other electrode and the piezoelectric layer 70 are formed for each pressure generating chamber 12 by patterning. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of the driving circuit and wiring.

An actuator device mentioned herein is defined by a combination of the piezoelectric element 300 and a vibration plate that can be displaced by the operation of the piezoelectric element 300. In the present embodiment, the vibration plate includes the elastic film 50, the insulating film 55 and the first electrode 60. However, the vibration plate is not limited to this structure, and, for example, only the first electrode 60 may act as the vibration plate without using the elastic film 50 or the insulating film 55. The piezoelectric element 300 may double as a vibration plate in substance.

In the present embodiment, the first electrode 60 includes a first titanium oxide layer 61 containing titanium oxide disposed on the insulating film 55, a platinum layer 62 containing platinum disposed on the first titanium oxide layer 61, and a second titanium oxide layer 63 containing titanium oxide disposed on the platinum layer 62, as shown in FIG. 3B. The conductivity of the first electrode 60 mainly depends on the platinum layer 62. On the other hand, the first and second titanium oxide layers 61 and 63 may have low conductivities, and may be formed discontinuously, for example, in an island manner. Preferably, the second titanium oxide layer 63 has a thickness of 3 nm or less. A second titanium oxide layer 63 of more than 3 nm in thickness has a low dielectric constant and may reduce the piezoelectric characteristics accordingly. By forming a second titanium oxide layer to a thickness of 3 nm or less, the piezoelectric characteristics can be enhanced.

The piezoelectric layer 70 is made of a piezoelectric material containing bismuth lanthanum ferrate manganate, that is, an $ABO_3$-type complex oxide containing bismuth (Bi), lanthanum (La), iron (Fe) and manganese (Mn). The A site of the $ABO_3$ structure, or perovskite structure, has 12 oxygen ligands, and the B site has 6 oxygen ligands to form an octahedron. Bi and La are present in the A site, and Fe and Mn are present in the B site.

The piezoelectric element of the present embodiment is produced by forming a platinum film being a precursor of the platinum layer 62 on a titanium base layer, forming a piezoelectric precursor film containing bismuth, lanthanum, iron and manganese on the platinum film, and crystallizing the piezoelectric precursor film by firing it. This process will be described in detail later. In this process, the titanium of the titanium base layer diffuses into the piezoelectric layer 70 through platinum grain boundaries while the piezoelectric precursor film is crystallized. Thus a highly insulating piezoelectric layer 70 can be formed. In addition, when this piezoelectric element is used as a piezoelectric actuator, it can produce a large distortion. The piezoelectric layer 70 can exhibit a diffraction pattern in which the area intensity of the peak derived from $ABO_3$ structures observed in $0°<2\theta<25°$ is at least 90% that of the total area intensity of peaks derived from $ABO_3$ structures observed in $20°<2\theta<50°$. This means that the piezoelectric layer is oriented preferentially in the (100) plane.

The amount of titanium diffused into the piezoelectric layer 70 is not particularly limited in the above process, but the titanium content in the piezoelectric layer 70 is preferably 5% by mass or less. An excessively high titanium content may adversely affect the piezoelectric properties other than the insulation property. In the present embodiment, even a piezoelectric layer 70 containing titanium as low as 0.1% to 0.5% by mass can be sufficiently insulating.

Preferably, the piezoelectric layer 70 containing bismuth (Bi), lanthanum (La), iron (Fe) and manganese (Mn) has a composition expressed by general formula (1):

$$(Bi_{1-x},La_x)(Fe_{1-y},Mn_y)O_3 \qquad (1)$$

where $0.10 \leq x \leq 0.20$ and $0.01 \leq y \leq 0.09$

Figure 15:
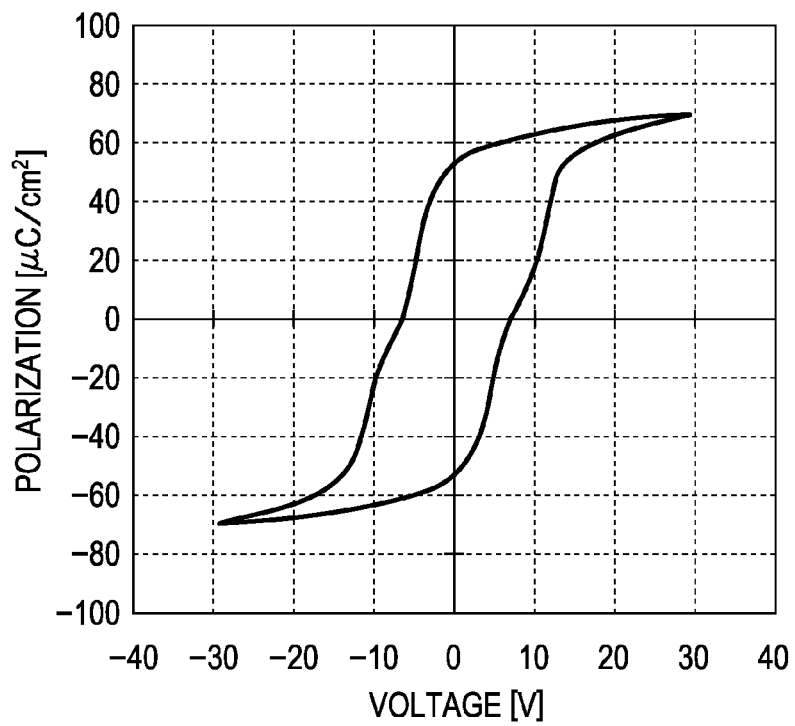
FIG. 15 is a P-V curve of Sample 12.
Figure 16:
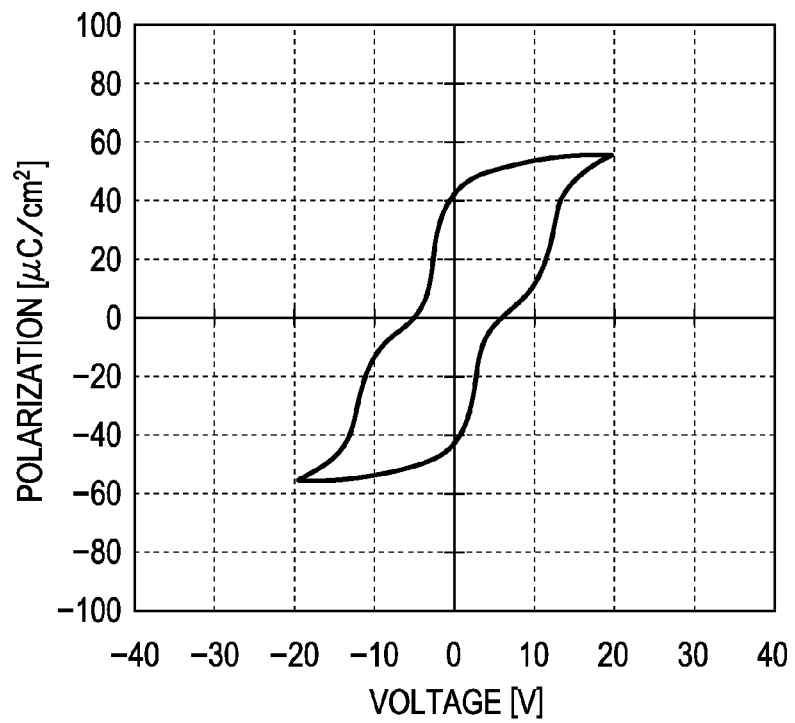
FIG. 16 is a P-V curve of Sample 13.
Figure 17:
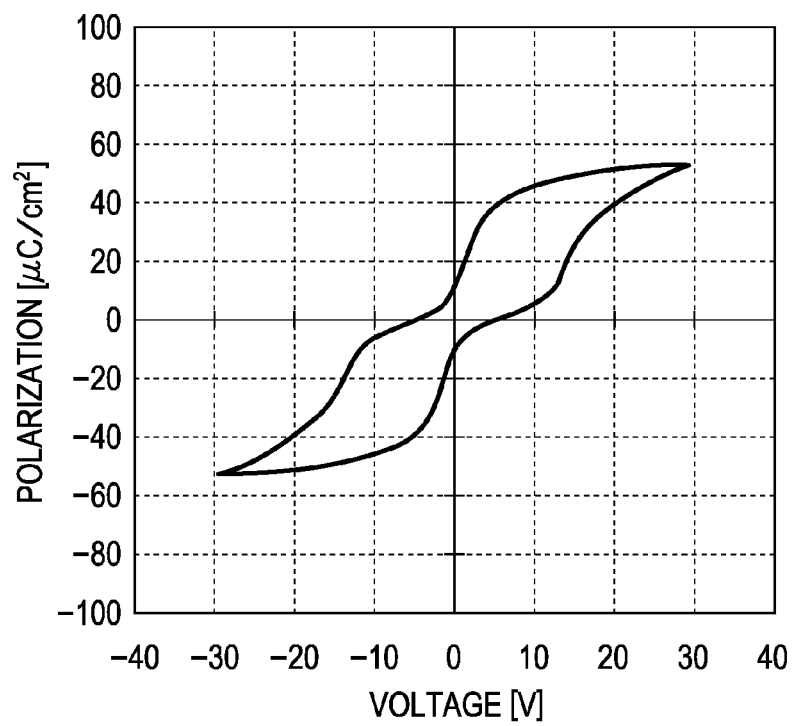
FIG. 17 is a P-V curve of Sample 14.
Figure 18:
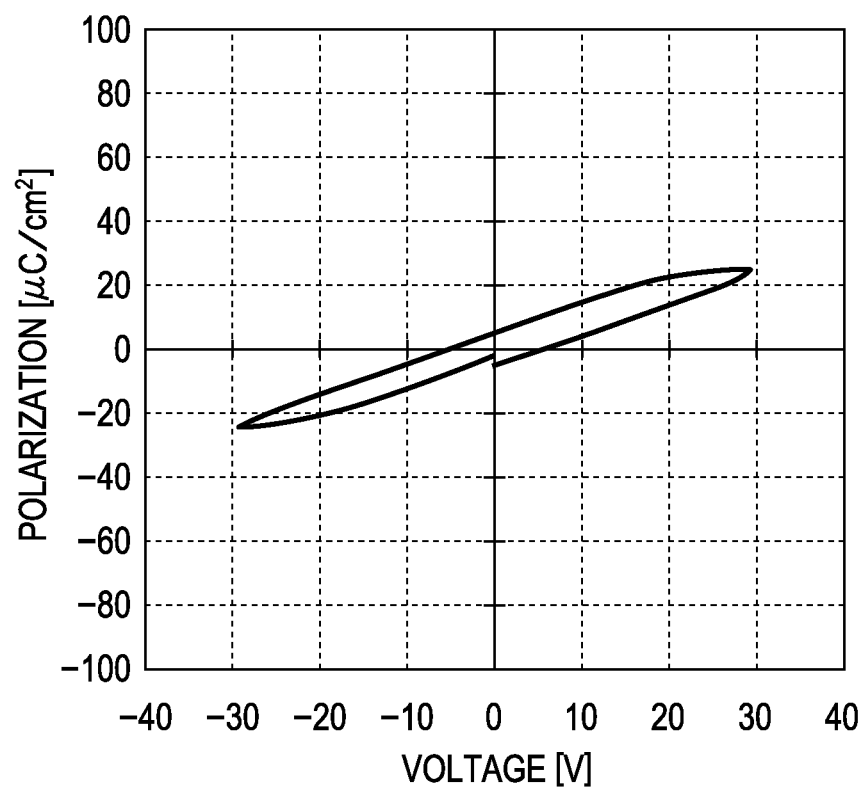
FIG. 18 is a P-V curve of Sample 15.

The piezoelectric layer 70 having a composition expressed by general formula (I) can be ferroelectric. The use of a ferroelectric piezoelectric layer 70 allows easy control of the distortion. Accordingly, when the piezoelectric element is used in a liquid ejecting head, the size of ink droplets ejected can be easily controlled. $ABO_3$ complex oxides containing Bi, La, Fe and Mn exhibited different characteristics and were ferroelectric, antiferroelectric or paraelectric, depending on the composition. Piezoelectric element samples (Samples 1 to 18) having different compositions expressed by general formula (1) were prepared, and triangular waves of 25 V or 30 V were applied to the samples to obtain their P (polarization)-V (voltage) relationship. The results are shown in FIGS. 4 to 18, and the compositions of the samples are shown in the Table below. Samples 16 to 18 caused too large leakage to be measured, and could not be used as piezoelectric materials. As shown in FIGS. 4 to 14, each of Samples 1 to 11, whose compositions satisfy $0.10 \leq x \leq 0.20$ and $0.01 \leq y \leq 0.09$, exhibited hysteresis loops distinctive of ferroelectric materials. Since the distortion of the Samples 1 to 11 varies linearly with the applied voltage, the distortion can be easily controlled. On the hand, Samples 12 to 14, whose compositions of general formula (I) did not satisfy $0.10 \leq x \leq 0.20$ or $0.01 \leq y \leq 0.09$, exhibited double hysteresis loops distinctive of antiferroelectric materials that have two hysteresis shapes respectively in a positive electric field and a negative electric field, as shown in FIGS. 15 to 17, and were therefore antiferroelectric. Sample 15, whose composition is also outside the desired ranges, was paraelectric as sown in FIG. 18. Samples 16 to 18 caused large leakage and could not be used as piezoelectric materials, as mentioned above. Thus, Samples 12 to 18 were not all ferroelectric.

TABLE

| | x | Y |
|---|---|---|
| Sample 1 | 0.10 | 0.03 |
| Sample 2 | 0.10 | 0.05 |
| Sample 3 | 0.10 | 0.09 |
| Sample 4 | 0.14 | 0.05 |
| Sample 5 | 0.17 | 0.03 |
| Sample 6 | 0.18 | 0.03 |
| Sample 7 | 0.20 | 0.01 |
| Sample 8 | 0.20 | 0.02 |
| Sample 9 | 0.19 | 0.03 |
| Sample 10 | 0.19 | 0.04 |
| Sample 11 | 0.19 | 0.05 |
| Sample 12 | 0.21 | 0.03 |
| Sample 13 | 0.24 | 0.05 |
| Sample 14 | 0.29 | 0.05 |
| Sample 15 | 0.48 | 0.05 |
| Sample 16 | 0.20 | 0.00 |
| Sample 17 | 0.10 | 0.00 |
| Sample 18 | 0.00 | 0.00 |

If the piezoelectric layer is made of an antiferroelectric material in which spontaneous polarizations are arranged antiparallel to adjacent ones, that is, if the piezoelectric layer is made of a material that can exhibit electric field-induced phase transition, electric field-induced phase transition occurs in the piezoelectric layer to produce a larger distortion when a certain voltage or more is applied. Thus, the antiferroelectric piezoelectric layer can produce a larger distortion than ferroelectric materials. However, it cannot operate unless the certain voltage or more is applied, and the distortion does not vary linearly with the voltage. The electric field-induced phase transition refers to a phase transition occurring in an electric field, and may be a transition from an antiferroelectric phase to a ferroelectric phase or a transition from a ferroelectric phase to an antiferroelectric phase. The ferroelectric phase is a state in which polarization axes extend in the same direction, and the antiferroelectric phase is a state in which polarization axes are arranged in antiparallel to adjacent ones. For example, a phase transition from an antiferroelectric phase to a ferroelectric phase is that antiparallel axes of the antiferroelectric phase are aligned in the same direction by rotation of 180° to turn into a ferroelectric phase. Such an electric field-induced phase transition expands or contracts the lattices to cause distortion. This distortion refers to phase transition distortion caused by electric field-induced phase transition. Substances in which such electric field-induced phase transition can occur refer to antiferroelectrics. Hence, the polarization axes of an antiferroelectric are antiparallel with no electric field applied, but are aligned in the same direction by applying an electric field. The P-V curve (relationship between the polarization P and the voltage V) of such an antiferroelectric material shows a double hysteresis loop having two hysteresis shapes respectively in a positive electric field and in a negative electric field. In the P-V curve, a transition from a ferroelectric phase to an antiferroelectric phase or a transition from an antiferroelectric phase to a ferroelectric phase occurs in regions where the polarization is sharply changed.

On the other hand, ferroelectrics do not exhibit double hysteresis P-V curves, unlike antiferroelectrics, and the distortion varies linearly with the applied voltage in a state where the polarization is aligned. Accordingly, the distortion of ferroelectrics can be easily controlled, and the size of droplets ejected can be easily controlled accordingly. Consequently, a single piezoelectric element can generate two types of vibration: small amplitude vibration generating microvibration; and large amplitude vibration producing a large excluded volume.

It is preferable that the piezoelectric layer 70 of the present embodiment exhibits a powder X-ray diffraction pattern having peaks of both ferroelectric phases having ferroelectricity and antiferroelectric phases having antiferroelectricity. By using a piezoelectric layer 70 in the morphotropic phase boundary (MPB) between antiferroelectric and ferroelectric phases, exhibiting peaks of ferroelectric phases and antiferroelectric phases, a piezoelectric element producing a large distortion can be provided. Preferably, the piezoelectric layer 70 contains a complex oxide expressed by general formula (I) satisfying the relationship $0.17 \le x \le 0.20$, preferably $0.19 \le x \le 0.20$. Complex oxides in this range exhibit powder X-ray diffraction spectra simultaneously having peaks of ferroelectric phases and peaks of antiferroelectric phases, as described in the Example later. Hence, these materials are in the MPB between antiferroelectric and ferroelectric phases, and thus, the piezoelectric element including such a piezoelectric layer can produce a large distortion.

The second electrode 80 of each piezoelectric element 300 is connected with a lead electrode 90 made of, for example, gold (Au) extending from one end at the ink supply channel 14 side of the second electrodes 80 to the surface of the insulating film 55.

A protective substrate 30 having a reservoir section 31 defining at least part of a reservoir 100 is joined to the flow channel substrate 10 having the piezoelectric elements 300 with an adhesive 35 so as to cover the first electrodes 60, the insulating film 55 and the lead electrodes 90. The reservoir section 31 passes through the thickness of the protective substrate 30 and extends along the widths of the pressure generating chambers 12. Thus, the reservoir section 31 communicates with the communicating section 13 of the flow channel substrate 10 to form the reservoir 100 acting as the common ink chamber of the pressure generating chambers 12. The communicating section 13 of the flow channel substrate 10 may be divided for each pressure generating chamber 12, and only the reservoir section 31 may serve as the reservoir. Alternatively, the flow channel substrate 10 may have only the pressure generating chambers 12, and the reservoir and ink supply channels 14 communicating with the respective pressure generating chambers 12 are formed in a member, such as the elastic film 50 or the insulating film 55, between the flow channel substrate 10 and the protective substrate 30.

Piezoelectric element-protecting section 32 is formed in the region of the protective substrate 30 corresponding to the piezoelectric elements 300. The Piezoelectric element-protecting section 32 has a space so that the piezoelectric elements 300 can operate without interference. The space of the piezoelectric element-protecting section 32 is intended to ensure the operation of the piezoelectric elements 300, and may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the thickness of the protective substrate 30. The respective lead electrodes 90 extending from the piezoelectric elements 300 are exposed in the through hole 33.

A driving circuit 120 is secured on the protective substrate 30 to drive the piezoelectric elements 300 arranged in parallel. The driving circuit 120 may be a circuit board, a semiconductor integrated circuit (IC) or the like. The driving circuit 120 is electrically connected to each lead electrode 90 with an electroconductive connection wire 121, such as a bonding wire.

Furthermore, a compliance substrate 40 including a sealing film 41 and a fixing plate 42 is joined on the protective substrate 30. The sealing film 41 is made of a flexible material having a low rigidity, and seals one side of the reservoir section 31. The fixing plate 42 is made of a relatively hard material. The portion of the fixing plate 42 opposing the reservoir 100 is completely removed in the thickness direction to form an opening 43; hence the reservoir 100 is closed at one end only with the flexible sealing film 41.

The ink jet recording head I of the present embodiment draws an ink through an ink inlet connected to an external ink supply means (not shown). The ink is delivered to fill the spaces from the reservoir 100 to the nozzle apertures 21. Then, the ink jet recording head I applies a voltage between the first electrode 60 and each second electrode 50 corresponding to the pressure generating chambers 62, according to the recording signal from the driving circuit 120. Thus, the elastic film 50, the insulating film 55, the first electrode 60 and the piezoelectric layers 70 are deflected to increase the internal pressure in the pressure generating chambers 12, thereby ejecting the ink from the nozzle apertures 21.

A method for manufacturing the ink jet recording head according to the first embodiment will be described with reference to FIG. 19A to 23B. FIGS. 19A to 23B are sectional views of a pressure generating chamber taken in the longitudinal direction.

Figure 19A:
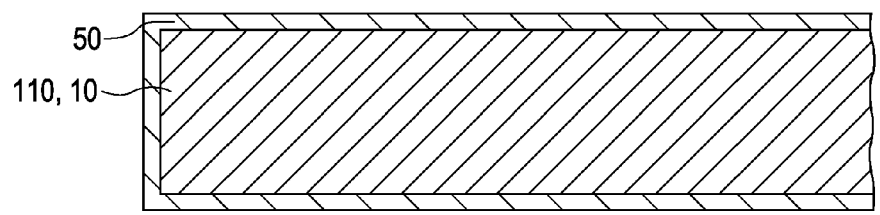
FIGS. 19A and 19B are sectional views showing a manufacturing process of the recording head according to the embodiment.
Figure 19B:
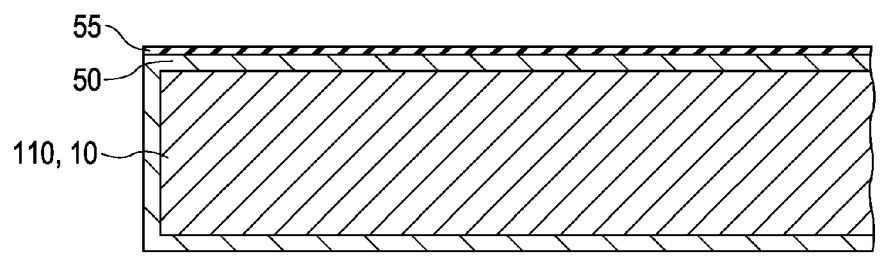

As shown in FIG. 19A, a silicon dioxide ($SiO_2$) film intended to be an elastic film 50 is formed on the surface of a silicon wafer 110 for a flow channel substrate by thermal oxidation or the like. Then, an insulating film 55 is formed of, for example, zirconium oxide on the elastic film 50 (silicon dioxide film) by reactive sputtering, thermal oxidation or the like, as shown in FIG. 19B.

Figure 20A:
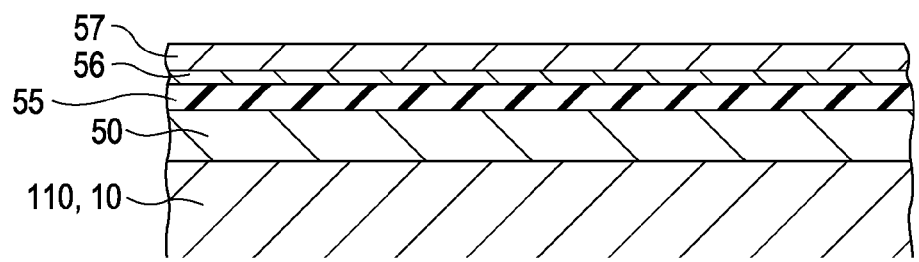
FIGS. 20A to 20C are sectional views showing the manufacturing process of the recording head according to the embodiment.

Then, a titanium film 56 is formed on the insulating film 55 by DC sputtering, ion sputtering or the like, as shown in FIG. 20A. Subsequently, a platinum film 57 is formed on the titanium film 56 by DC sputtering or the like, followed by patterning. By appropriately adjusting the thicknesses, heating conditions or other conditions of the titanium film 56 and the platinum film 57, the amount of titanium diffused during the crystallization of the piezoelectric precursor film described below can be adjusted.

Then, a piezoelectric layer 70 is formed on the platinum film 57. The piezoelectric layer 70 may be formed by any method without particular limitation. For example, metalorganic decomposition (MOD) may be applied, in which a solution containing an organic metal compound dissolved or dispersed in a solvent is applied onto the platinum film 57, and the coating of the solution is dried and then fired to form a metal oxide piezoelectric layer 70. The piezoelectric layer 70 may be formed by a liquid process or a solid process without being limited to MOD. Exemplary processes include a sol-gel method, laser ablation, sputtering, pulsed laser deposition (PLD), CVD, and aerosol deposition.

Figure 20B:
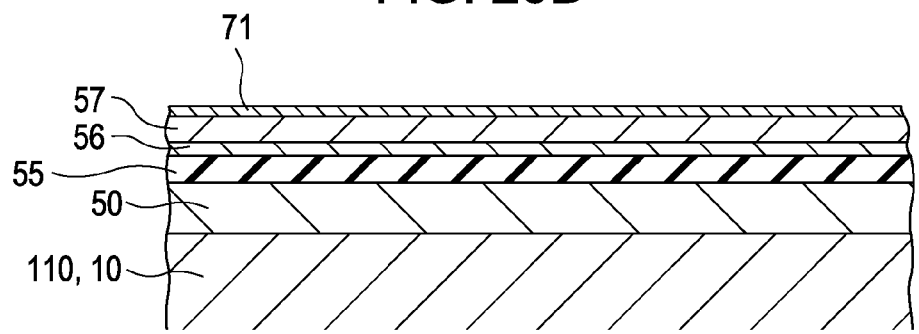

More specifically, the piezoelectric layer 70 is formed as follows. First, as shown in FIG. 20B, a sol or MOD solution (precursor solution) containing organic metal compounds containing bismuth, lanthanum, iron and manganese in a desired proportion is applied onto the platinum film 57 by spin coating or the like to form a piezoelectric precursor film 71 (coating).

The precursor solution is prepared by mixing organic metal compounds respectively containing bismuth, lanthanum, iron and manganese so that the metals have desired mole fractions, and dissolving or dispersing the mixture in alcohol or other organic solvents. Organic metal compounds containing bismuth, lanthanum, iron or manganese include metal alkoxides, organic acid salts, and β-diketone complexes. For example, the organic metal compound containing bismuth may be bismuth 2-ethylhexanoate. For example, the organic metal compound containing lanthanum may be lanthanum 2-ethylhexanoate. For example, the organic metal compound containing iron may be iron 2-ethylhexanoate. For example, the organic metal compound containing manganese may be manganese 2-ethylhexanoate.

Subsequently, the piezoelectric precursor film 71 is heated to a predetermined temperature to be dried for a certain time (drying). Then, the dried piezoelectric precursor film 71 is heated to a predetermined temperature and allowed to stand for a certain time to be degreased (degreasing). The degreasing mentioned herein is performed to convert organic components in the piezoelectric precursor film 71 into, for example, $NO_2$, $CO_2$ or $H_2O$ and thus to remove the organic components. The drying and degreasing may be performed in any atmosphere without particular limitation, and may be performed in the air or an inert gas atmosphere.

Figure 20C:
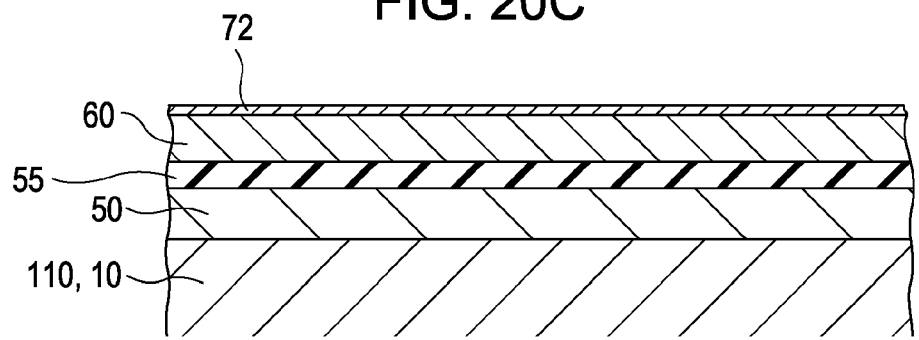

Then, as shown in FIG. 20C, the piezoelectric precursor film 71 is heated to a predetermined temperature, for example, to about 600 to 700° C., and allowed to stand for a certain time in an inert gas atmosphere, thus being crystallized to form a piezoelectric film 72 (firing).

The drying, the degreasing and the firing can be performed with a heating apparatus, such as a rapid thermal annealing (RTA) apparatus using an infrared lamp for heating or a hot plate.

Figure 21A:
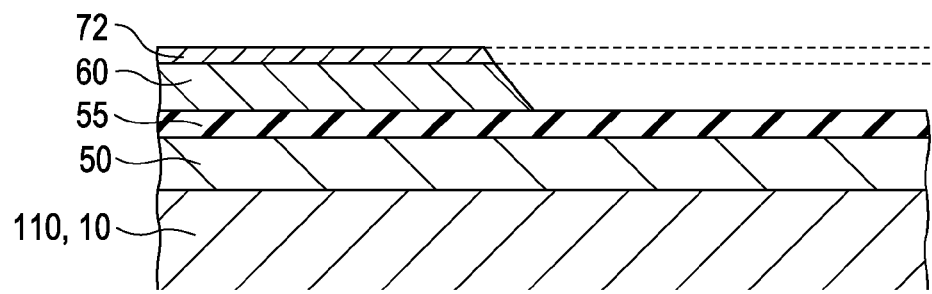
FIGS. 21A and 21B are sectional views showing the manufacturing process of the recording head according to the embodiment.

Then, as shown in FIG. 21A, a resist layer having a predetermined shape (not shown) is formed on the piezoelectric film 72, and the piezoelectric film 72 and the first electrode 60 are simultaneously patterned using the resist layer as a mask so that their sides are inclined.

Figure 21B:
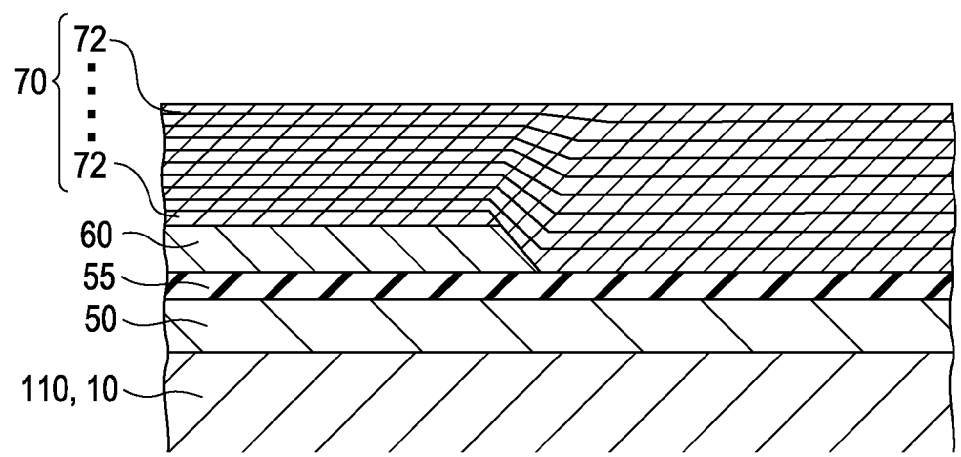

After removing the resist layer, the sequence of coating, drying and degreasing, or the sequence of coating, drying, degreasing and firing is repeated according to the desired thickness. Thus a piezoelectric layer 70 having a desired thickness including a plurality of piezoelectric films 72 is formed, as shown in FIG. 21B. If, for example, a coating formed by a single coating operation has a thickness of about 0.1 μm, the piezoelectric layer 70 including 10 piezoelectric films 72 has a total thickness of about 1.1 μm. Although a plurality of piezoelectric films 72 are layered in the present embodiment, the piezoelectric layer 70 may include only a single piezoelectric film 72.

In this operation for forming the piezoelectric layer 70, the titanium in the titanium film 56 formed at the flow channel substrate 10 side of the platinum film 57 intended to be the first electrode 60 is diffused by firing the piezoelectric precursor film 71 to crystallize it in an inert gas atmosphere. For example, the titanium is diffused to the piezoelectric film 72, and consequently, the resulting piezoelectric layer 70 contains titanium. Probably, the titanium in the titanium film 56 diffuses into the piezoelectric layer 70 through the grain boundaries in the platinum film 57 between the titanium film 56 and the piezoelectric layer 70.

As described above, by heating the piezoelectric precursor film 71 on the platinum film 57 overlying the titanium film 56 in an inert gas atmosphere to crystallize the precursor film 71, the titanium in the titanium film 56 is diffused. Consequently, the insulation is increase to reduce the occurrence of leakage current. In addition, the distortion can be increased. Furthermore, the resulting piezoelectric layer 70 can exhibit a diffraction spectrum in which the area intensity of the peak derived from ABO₃ structures observed in 20°<2θ<25° is at least 90% that of the total area intensity of peaks derived from ABO₃ structures observed in 20°<2θ<50°. This means that the piezoelectric layer 70 is oriented preferentially in the (100) plane.

The platinum film 57 containing platinum is turned into the platinum layer 62 through the crystallization of the piezoelectric precursor film 71, and the resulting platinum layer 62 may contain titanium or titanium oxide, depending on the degree of the diffusion of titanium. In addition, in the present embodiment, the diffused titanium forms a second titanium oxide layer 63 containing titanium oxide between the platinum layer 62 and the piezoelectric layer 70. Also, the titanium not diffused from the titanium film 56 at the flow channel substrate 10 side of the platinum layer 62 forms a first titanium oxide layer 61 containing titanium oxide. However, the first titanium oxide layer 61 or the second titanium oxide layer 63 may be hardly formed, depending on the degree of the diffusion of titanium. Although, in the present embodiment, titanium is diffused up to the inside of the piezoelectric layer 70, the piezoelectric layer 70 does not necessarily contain titanium as long as the titanium diffuses up to the interface between the piezoelectric layer 70 and the platinum layer 62. The amount of titanium diffused during the crystallization of the piezoelectric precursor film 71 can be adjusted by controlling the firing temperature and the firing time.

The inert gas atmosphere mentioned herein refers to an atmosphere of a noble gas, such as helium or argon, an inert gas, such as nitrogen, or a mixture of these gases. For heating, the heating apparatus may be purged with an inert gas, or the inert gas may be allowed to flow in the heating apparatus. The concentration of the inert gas is not necessarily 100%, as long as titanium can diffuse from the titanium film 56 at the flow channel substrate 10 side of the platinum film 57. For example, the inert gas may contain 20% or less of oxygen.

Figure 22A:
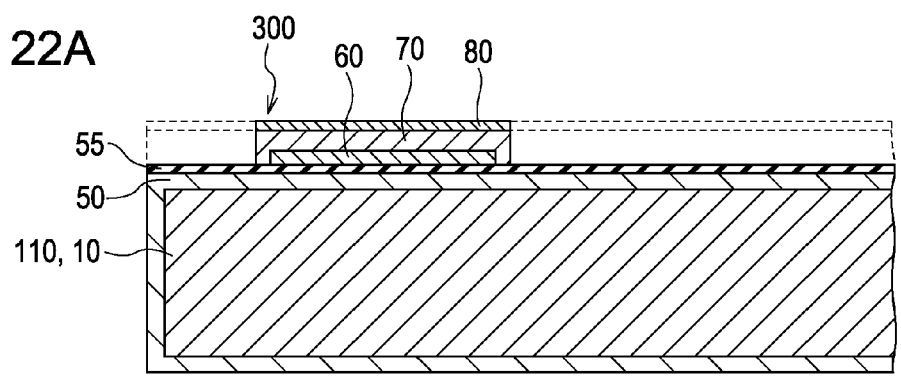
FIGS. 22A to 22C are sectional views showing the manufacturing process of the recording head according to the embodiment.

After the piezoelectric layer 70 is formed, a second electrode 80 is formed of platinum on the piezoelectric layer 70 by sputtering or the like, as shown in FIG. 22A, and the piezoelectric layer 70 and the second electrode 80 are simultaneously patterned to form piezoelectric elements 300, each including the first electrode 60, the piezoelectric layer 70 and the second electrode 80, in the regions corresponding to the pressure generating chambers 12. The patterning of the piezoelectric layer 70 and the second electrode 80 can be performed at one time by dry etching through a resist layer (not shown) having a predetermined shape. After this operation, post-annealing may be performed at a temperature in the range of 600 to 700° C., if necessary. Thus favorable interfaces can be formed between the piezoelectric layer 70 and the first electrode 60 and between the piezoelectric layer 70 and the second electrode 80, and the crystallinity of the piezoelectric layer 70 can be enhanced.

Figure 22B:
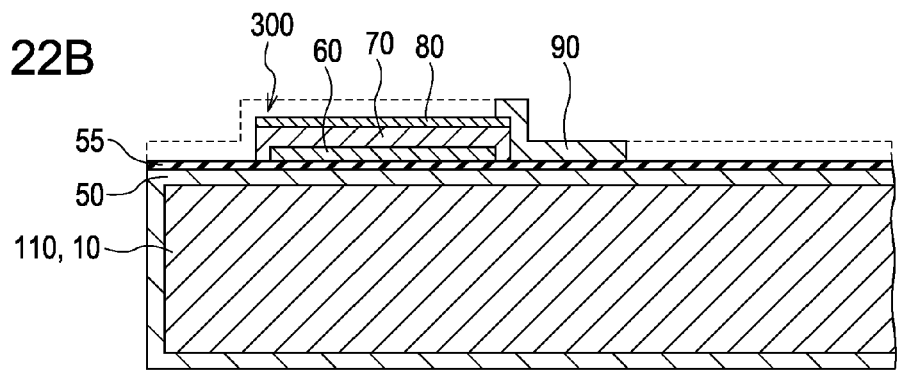

Then, as shown in FIG. 22B, a film is formed of, for example, gold (Au), over the entire surface of the flow channel substrate wafer 110, and is patterned into lead electrodes 90 for each piezoelectric element 300 through a mask pattern (not shown) made of, for example, resist.

Figure 22C:
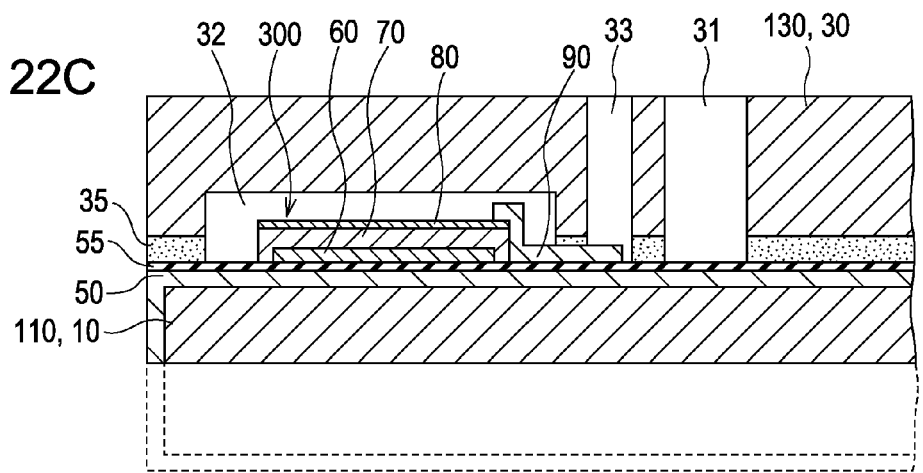

Then, as shown in FIG. 22C, after a silicon protective substrate wafer 130 for a plurality of protective substrates 30 is bonded to the piezoelectric element 300 side of the flow channel substrate wafer 110 with an adhesive 35, the thickness of the flow channel substrate wafer 110 is reduced.

Figure 23A:
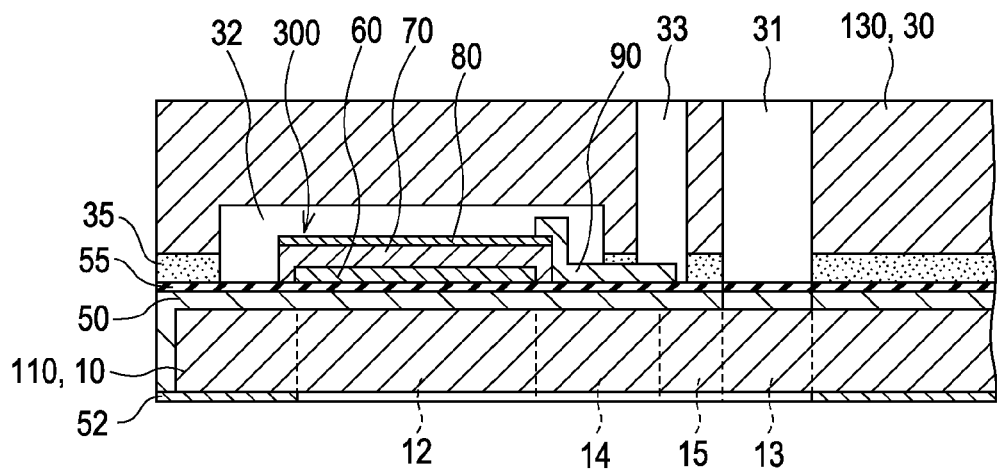
FIGS. 23A and 23B are sectional views showing the manufacturing process of the recording head according to the embodiment.

Then, a film for a mask 52 is formed on the surface of the flow channel substrate wafer 110 opposite to the protective substrate wafer 130 and is patterned into a mask 52 having a predetermined shape, as shown in FIG. 23A.

Figure 23B:
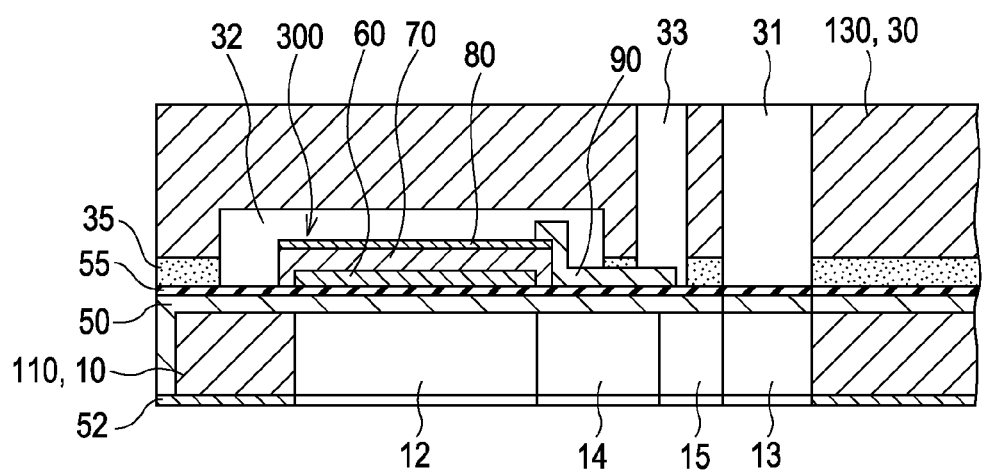

Subsequently, as shown in FIG. 23B, the flow channel substrate wafer 110 is subjected to anisotropic etching (wet etching) using an alkaline solution, such as KOH, through the mask 52, to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and the protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 have been removed, and a compliance substrate 40 is joined to the protective substrate wafer 13. The flow channel substrate wafer 110 joined with other substrates together is cut into chips, each including a flow channel substrate 10 and other members. Thus an ink jet recording head I of the present embodiment is produced.

The invention will be further described in detail with reference to the Example below. However, the invention is not limited to the following Example.

EXAMPLE

First, a silicon dioxide film was formed on a silicon substrate by thermal oxidation. Then, a zirconium oxide film was formed to a thickness of 400 nm on the silicon dioxide film by radio frequency (RF) sputtering. Subsequently, a titanium film was formed to a thickness of 20 nm on the zirconium oxide film by direct current (DC) sputtering. Then, a platinum film was formed to a thickness of 130 nm on the titanium film by DC sputtering.

Subsequently, a piezoelectric layer was formed on the platinum film by spin coating in the following process. First, a precursor solution was prepared by mixing solutions of bismuth 2-ethylhexanoate, lanthanum 2-ethylhexanoate, iron 2-ethylhexanoate and manganese 2-ethylhexanoate in xylene or octane in a predetermined proportion. The precursor solution was dropped onto the platinum film on the substrate, and the substrate was spun at 500 rpm for 5 seconds and then at 1500 rpm for 30 seconds to form a piezoelectric precursor film (coating). The resulting piezoelectric precursor film was dried and degreased at 350° C. in the air for 3 minutes (drying and degreasing). After repeating the sequence of the coating and the drying and degreasing twice, the precursor film was fired in a heating apparatus in which nitrogen was flowing at a flow rate of 500 cc/min, by rapid thermal annealing (RTA) at 650° C. for 2 minutes (firing). This operation of firing together after repeating the sequence twice of the coating and the drying and degreasing were repeated three times. The resulting films were fired in a heating apparatus in which nitrogen was flowing at a flow rate of 500 cc/min, by RTA at 650° C. for 5 minutes, and thus a piezoelectric layer having a thickness of 450 nm was formed through a total of six times of coating.

Then, a platinum film was formed to a thickness of 100 nm as a second electrode on the piezoelectric layer by DC sputtering, and the resulting structure was fired in a heating apparatus in which nitrogen was flowing at a flow rate of 500 cc/min, by RTA at 650° C. for 5 minutes. Thus a piezoelectric element was completed which included a piezoelectric layer made of an ABO₃-type complex oxide having a composition expressed by general formula (I) wherein x=0.19 and y=0.03, and further containing titanium.

Comparative Example 1

A piezoelectric element was produced by the same operation as in the Example except that RTA was performed in a heating apparatus in which oxygen was flowing at a flow rate of 500 cc/min instead of nitrogen flowing at a flow rate of 500 cc/min.

Comparative Example 2

A piezoelectric element was produced by the same operation as in the Example except that a titanium oxide film was formed on the zirconium oxide film, instead of the titanium film, and the piezoelectric layer was formed over the titanium oxide film.

Comparative Example 3

A piezoelectric element was produced by the same operation as in the Example except that the piezoelectric layer was formed on an iridium film formed to a thickness of 20 nm on the platinum film by DC sputtering.

Comparative Example 4

A piezoelectric element was produced by the same operation as in the Example except that a titanium oxide film was formed on the zirconium oxide film, instead of the titanium film so that the piezoelectric layer was formed over the titanium oxide film, and except that the RTA was performed in a heating apparatus in which oxygen was flowing instead of nitrogen at a flow rate of 500 cc/min.

Experiment 1

Figure 24:
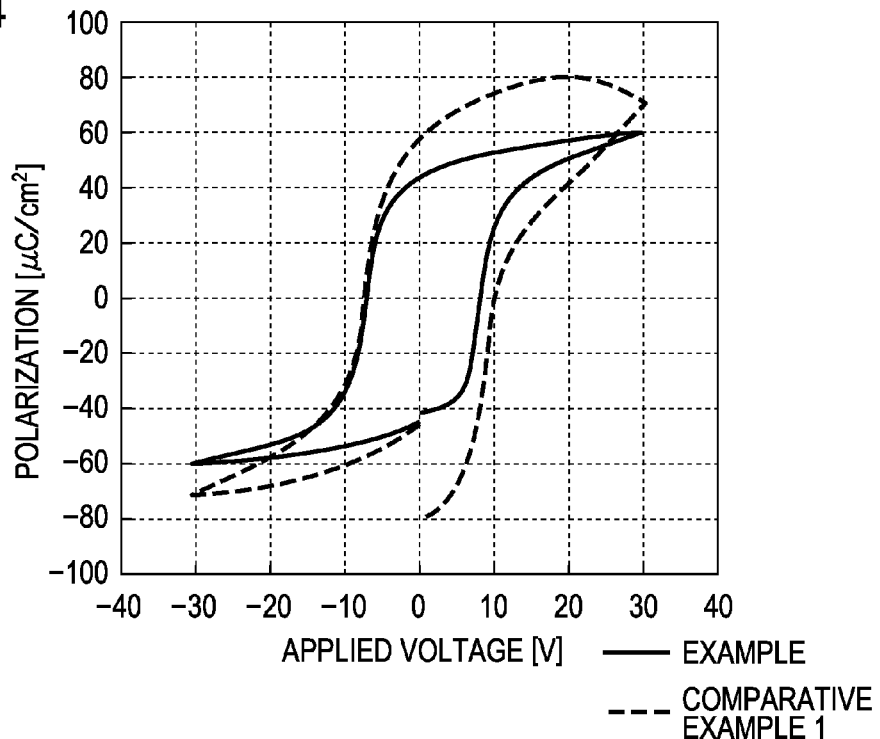
FIG. 24 is a plot of P-V curves of the Example and Comparative Example 1.
Figure 25:
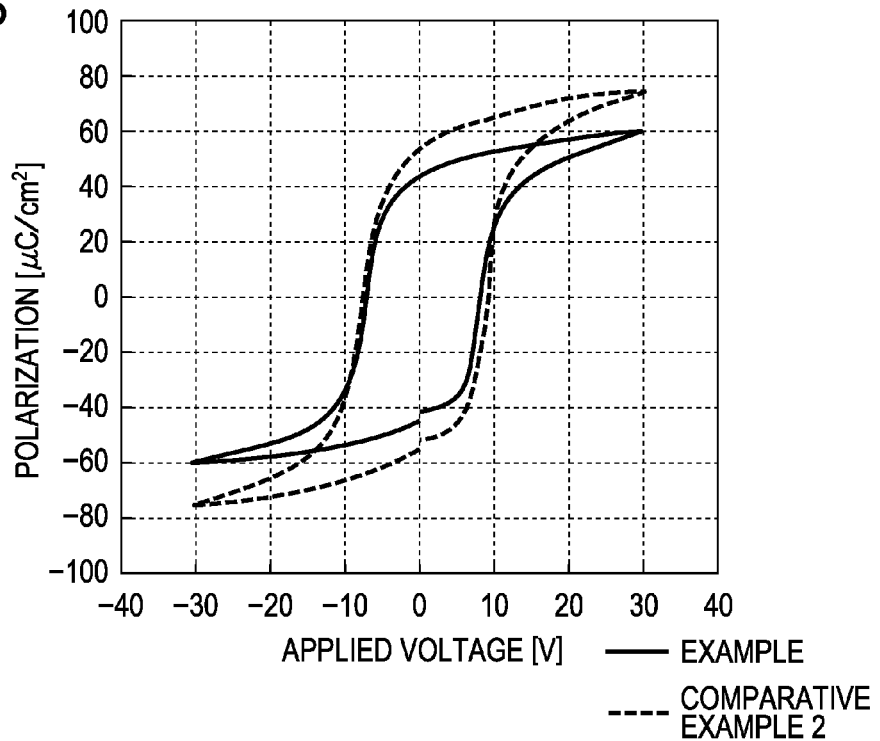
FIG. 25 is a plot of P-V curves of the Example and Comparative Example 2.
Figure 26:
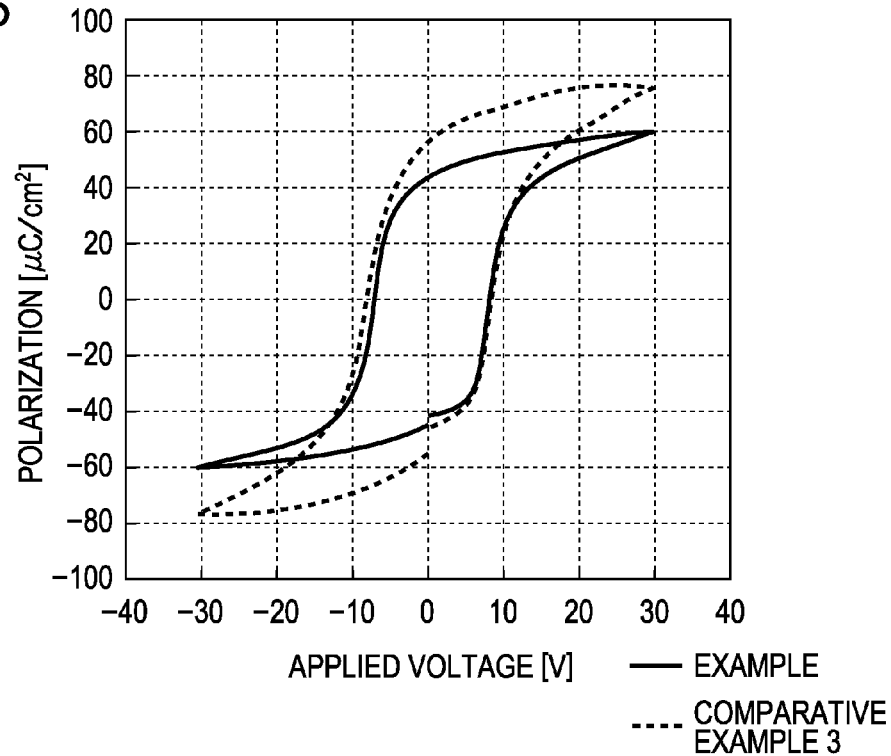
FIG. 26 is a plot of P-V curves of the Example and Comparative Example 3.

The relationships between the polarization and the voltage (P-V curves) of the piezoelectric elements of the Example and Comparative Examples 1 to 3 were obtained with a ferroelectric tester FCE-1A (manufactured by TOYO) by applying triangular waves of 1 kHz in frequency using an electrode pattern with $\phi=400$ μm. The results are shown in FIGS. 24 to 26. For comparison, the result of the Example is shown in all of FIGS. 24 to 26.

As shown in FIGS. 24 to 26, the Example, in which the crystallization was performed on the titanium base layer in a nitrogen atmosphere, exhibited a good hysteresis curve, and leakage did not occur. On the other hand, it is shown that leakage occurred in the hysteresis curves of Comparative Example 1, in which the piezoelectric precursor film was crystallized in an oxygen atmosphere, Comparative Example 2, in which a titanium oxide film was used instead of the titanium film as the base layer underlying the platinum film, and Comparative Example 3, in which an iridium film was formed on the platinum film.

Experiment 2

Figure 27:
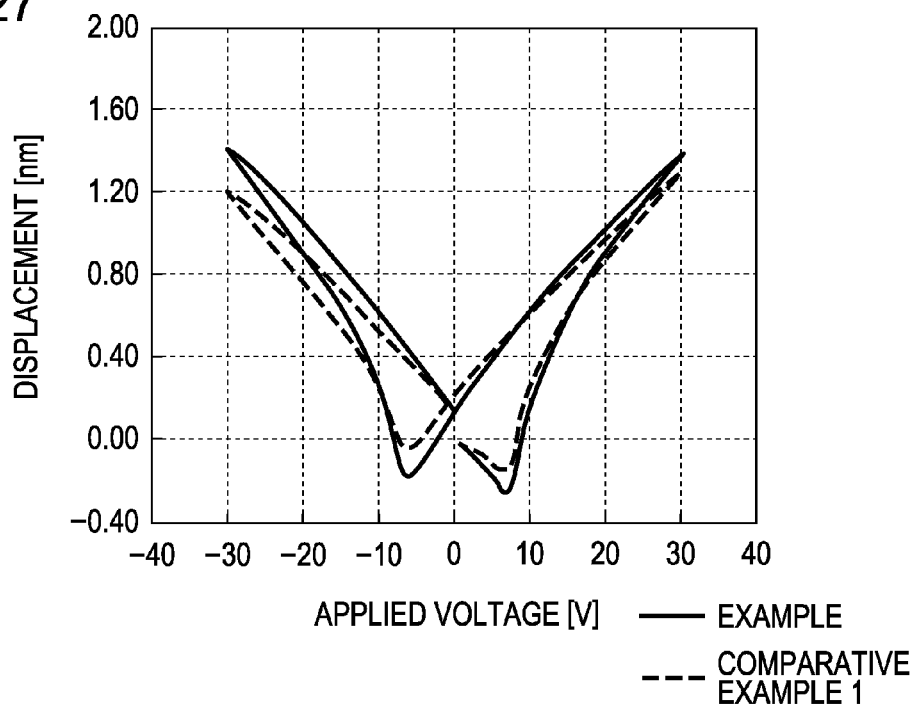
FIG. 27 is a plot of S-V curves of the Example and Comparative Example 1.
Figure 28:
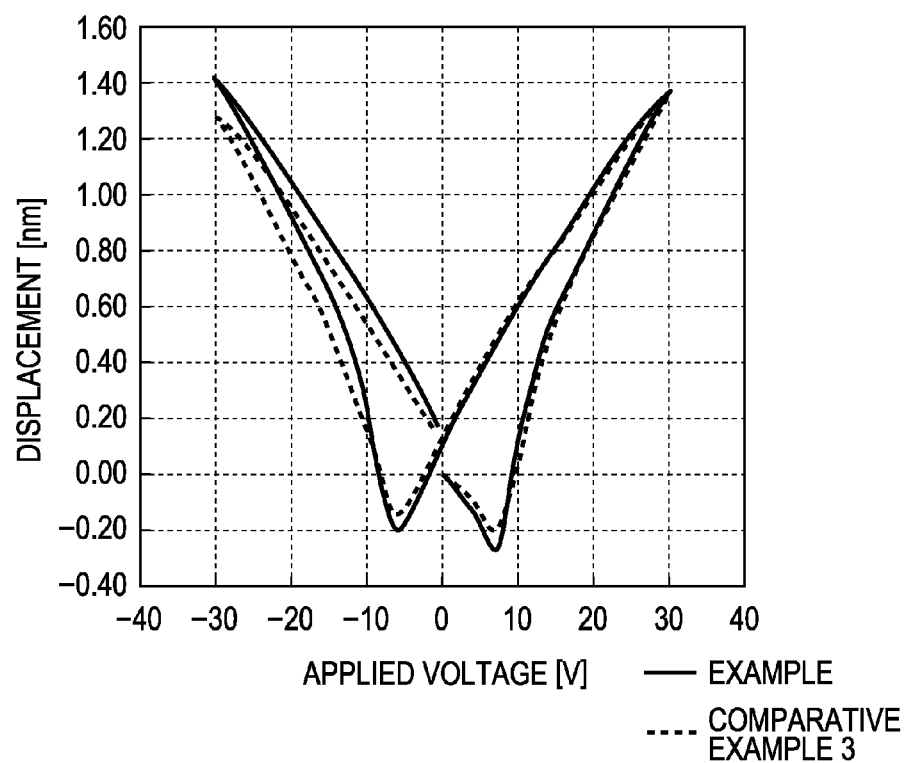
FIG. 28 is a plot of S-V curves of the Example and Comparative Example 3.

The relationships between the electric field-induced distortion and the electric field intensity (S-V curve) of the piezoelectric elements of the Example and Comparative Examples 1 and 3 were obtained at room temperature with a double-beam laser interferometer (DBLI) manufactured by aix-ACCT by applying a voltage of 1 kHz in frequency using an electrode pattern with $\phi=500$ μm. The results are shown in FIGS. 27 and 28. For comparison, the result of the Example is shown in both figures.

FIGS. 27 and 28 show that the Example, in which crystallization was performed in a nitrogen atmosphere, exhibited larger displacement than Comparative Examples 1 to 3, and thus had superior piezoelectric characteristics. In addition, it was confirmed that the piezoelectric element of the Example exhibits a large electric field-induced distortion, and that it is ferroelectric and has a linearity with voltage that ferroelectrics do not exhibit.

Experiment 3

Figure 29:
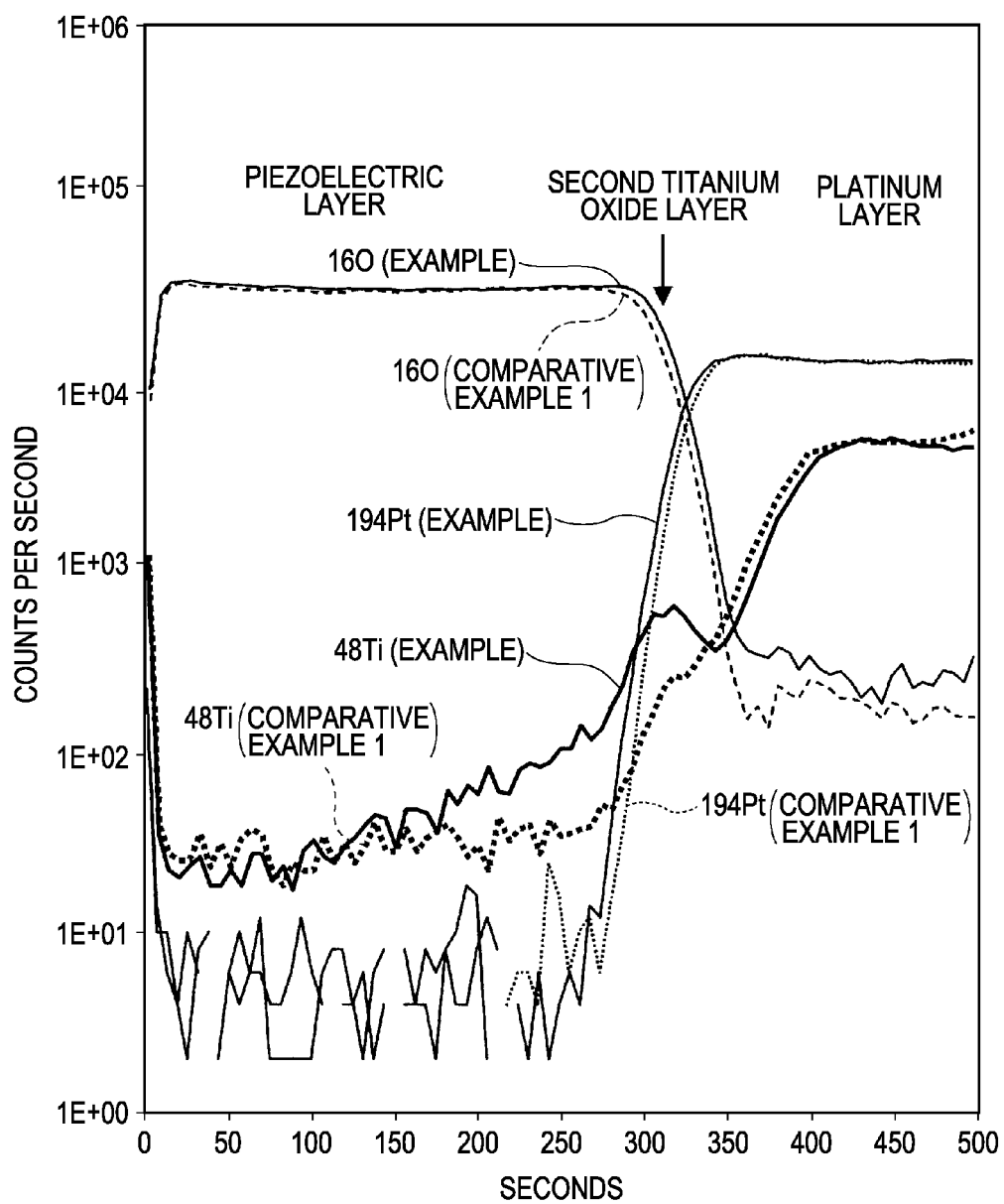
FIG. 29 is a plot of SIMS analysis results of the Example and Comparative Example 1.

The secondary ion mass spectra (SIMS) of the piezoelectric elements of the Example and Comparative Example 1 were observed from the piezoelectric layer 70 in the thickness direction after the second electrode was removed. The results are shown in FIG. 29. The left of the figure is the second electrode side, and the right is the substrate side. FIG. 29 shows that in the Example, in which the piezoelectric precursor film was crystallized in a nitrogen atmosphere, titanium was diffused from the titanium base layer. The diffused titanium segregated in the platinum layer and the piezoelectric layer. This shows that the titanium was diffused up to the inside of the piezoelectric layer. This result and the results of Experiment 1 suggest that the insulation of the piezoelectric element can be enhanced by diffusing titanium. In the Example, a peak of titanium is present between the platinum layer and the piezoelectric layer, as indicated by the arrow in FIG. 29. This suggests that the second titanium oxide layer was formed in this region. The thickness of the second titanium oxide layer was measured by transmission electron microscopy (TEM), and the result was 1 nm.

On the other hand, the result of Comparative Example 1 shows that the titanium in the titanium film underlying the platinum film cannot be diffused by crystallizing the piezoelectric precursor film in an oxygen atmosphere. This result and the results of Experiment 1 suggest that in order to diffuse titanium to enhance the insulation of the piezoelectric element, the crystallization of the piezoelectric precursor film is performed in a nitrogen atmosphere. In Comparative Example 1, a peak of titanium was not observed between the platinum layer and the piezoelectric layer, unlike the Example. This suggests that the second titanium oxide is not formed in this region.

Experiment 4

Figure 30:
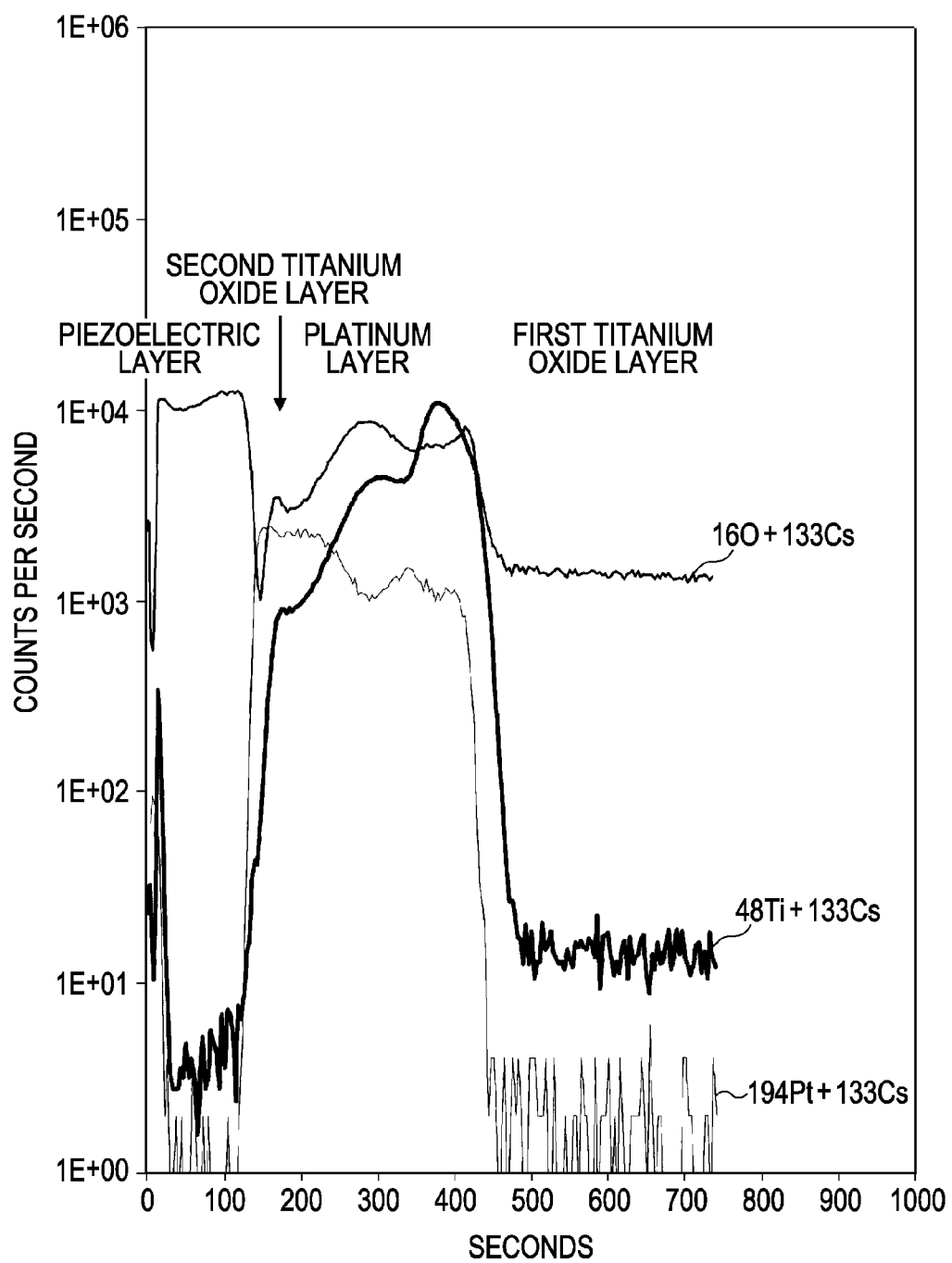
FIG. 30 is a plot of SIMS analysis results of the Example.
Figure 31:
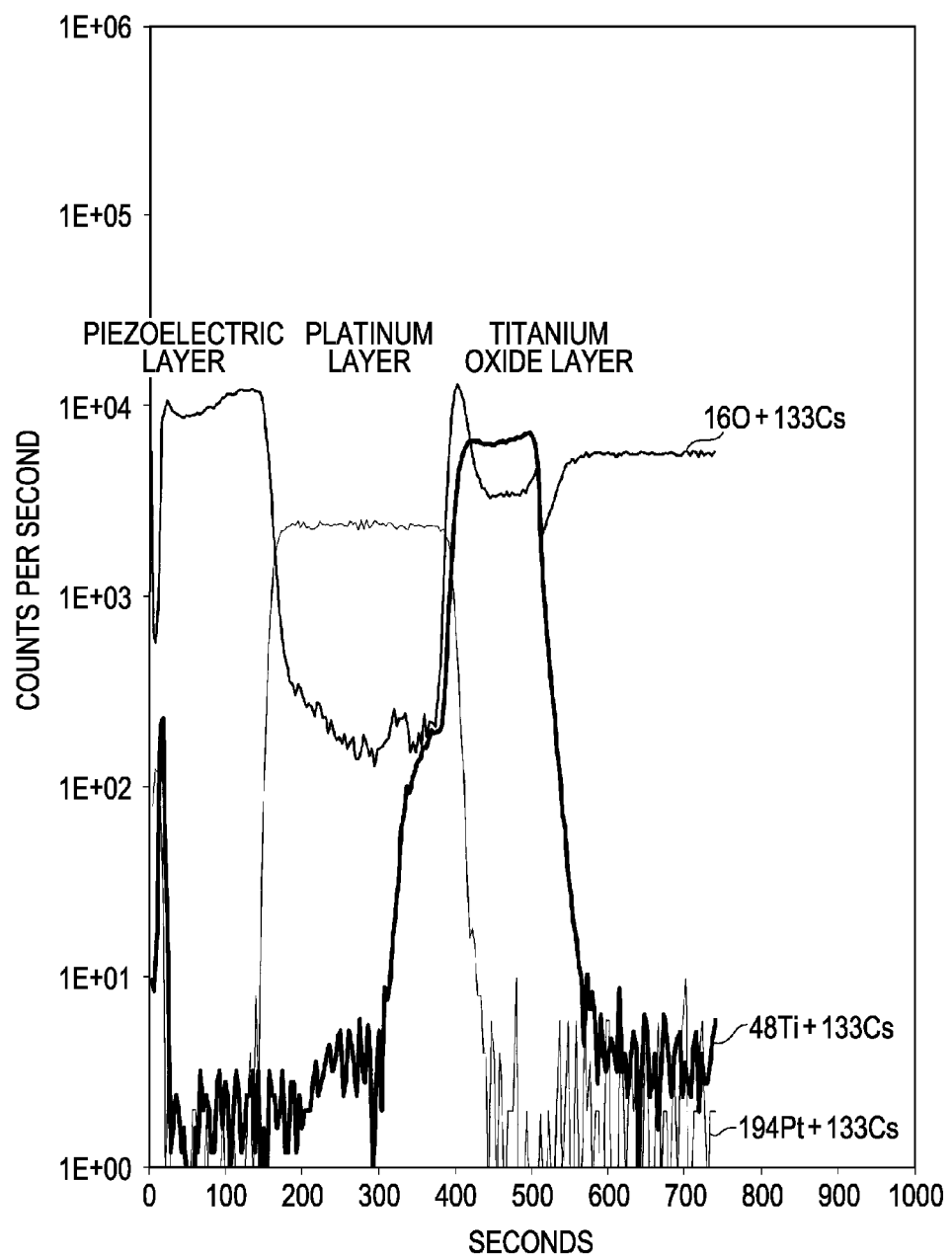
FIG. 31 is a plot of SIMS analysis results of Comparative Example 2.

The secondary ion mass spectra (SIMS) of the piezoelectric element of the Example and Comparative Example 2 were observed from the piezoelectric layer 70 in the thickness direction after the second electrode was removed. The results of the Example are shown in FIG. 30, and the results of Comparative Example 2 are shown in FIG. 31. The left of the figure is the second electrode side, and the right is the substrate side. These results show that in the Example, titanium was diffused from the titanium film underlying the platinum film, as in Experiment 3. The diffused titanium segregated in the platinum layer and the piezoelectric layer. This shows that the titanium was diffused up to the inside of the piezoelectric layer.

On the other hand, the results of Comparative Example 2, in which a titanium oxide film was formed instead of the titanium film as the base layer, show that titanium is not diffused even by crystallizing the piezoelectric precursor film in a nitrogen atmosphere. This suggests that in order to diffuse titanium to enhance the insulation, the base layer is made of titanium.

Experiment 5

The piezoelectric element of the Example and Comparative Examples 1 to 4 were subjected to powder X-ray diffraction analysis to obtain diffraction patterns of the piezoelectric layers at $\phi=\psi=0°$ with D8 Discover (manufactured by Bruker AXS) using CuKα rays at room temperature. The results of the Example and Comparative Examples 1, 2 and 4 are shown in FIG. 32, and the result of Comparative Example 3 is shown in FIG. 33 together with the results of the Example and Comparative Example 2.

Figure 32:
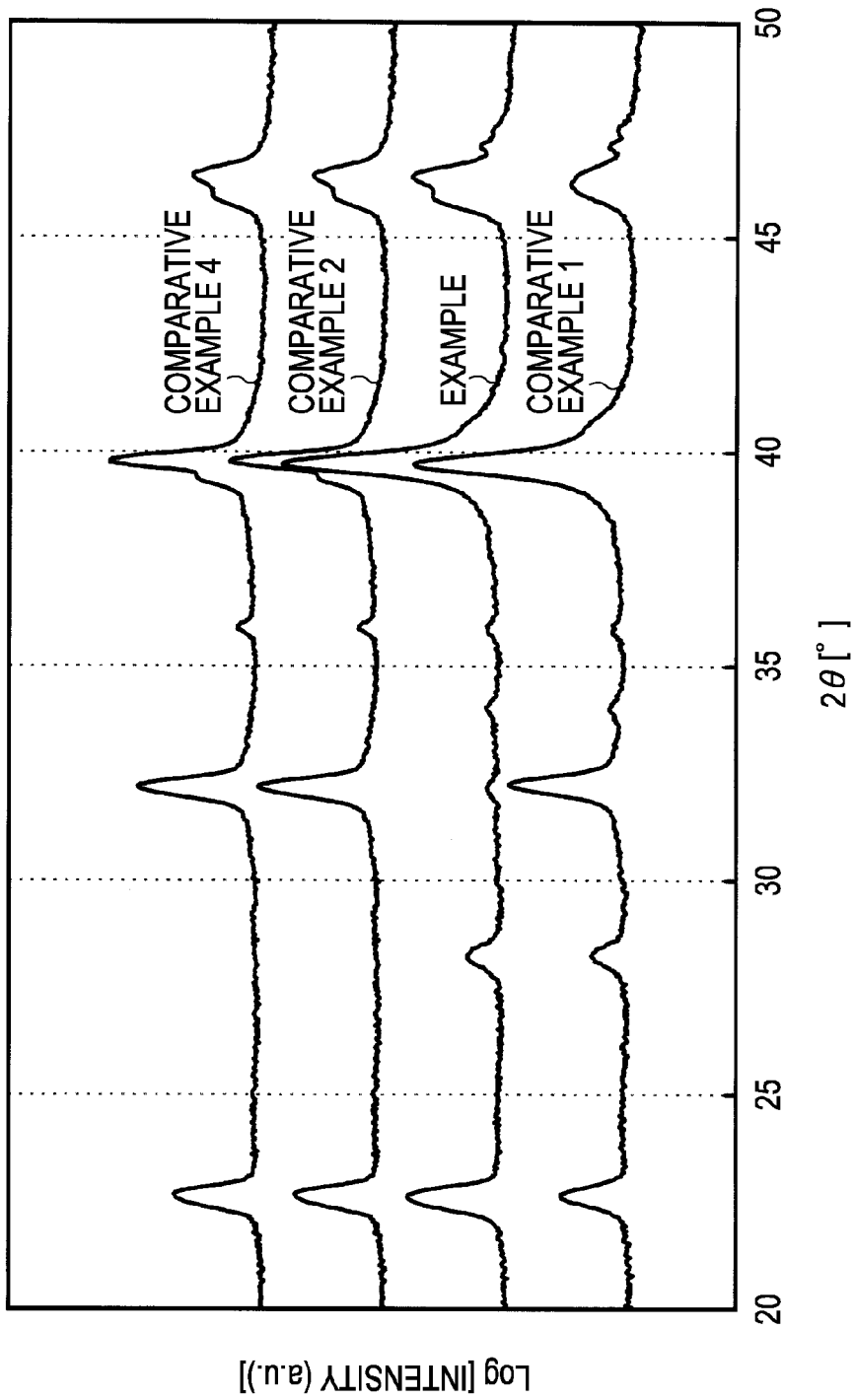
FIG. 32 is X-ray diffraction patterns of the Example and Comparative Examples.
Figure 33:
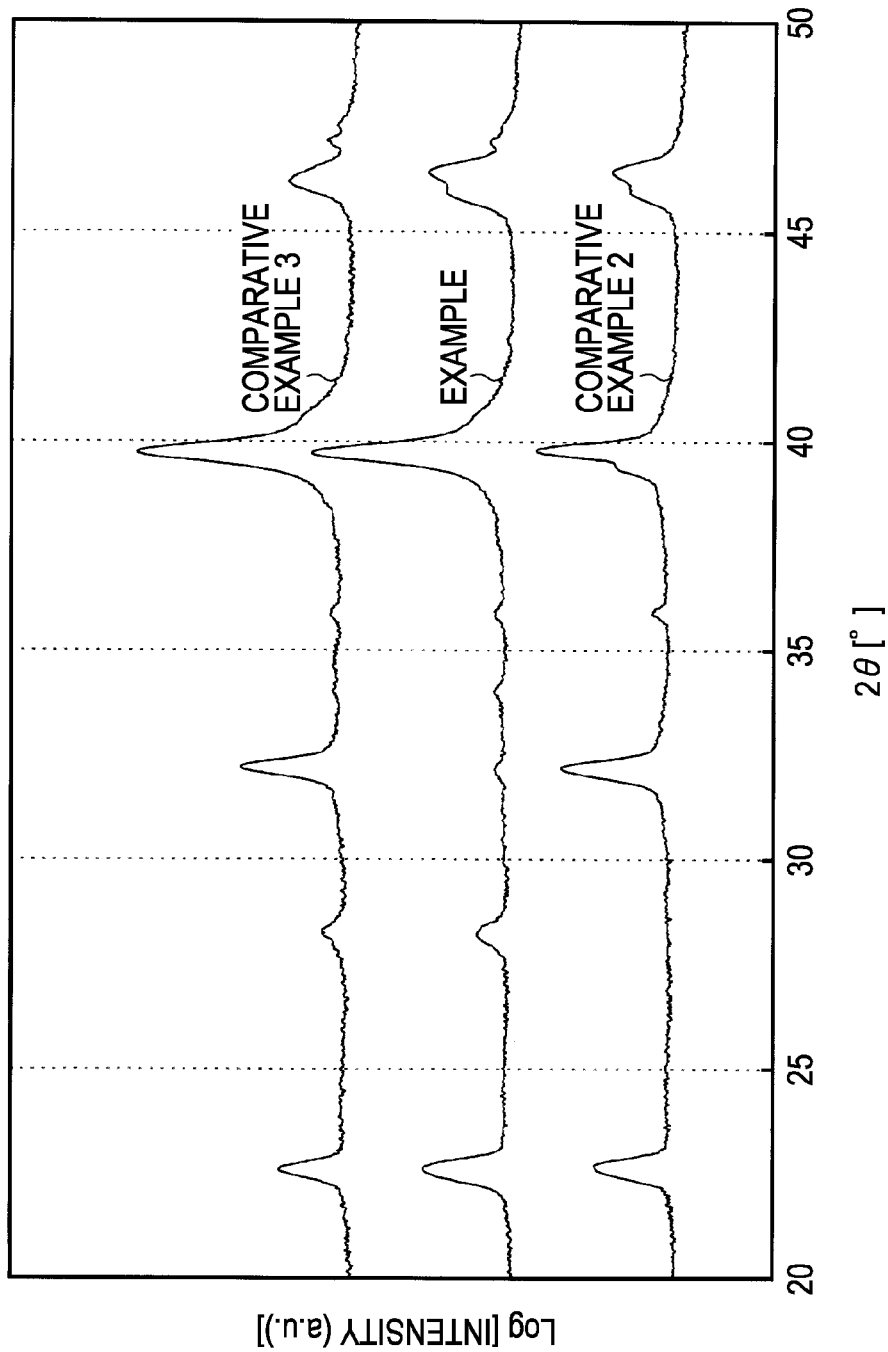
FIG. 33 is X-ray diffraction patterns of the Example and Comparative Examples.

FIGS. 32 and 33 show that the powder diffraction patterns were varied depending on the atmosphere for RTA, the material of the base layer underlying the platinum film, and whether or not the platinum film is used for the first electrode, and that only the piezoelectric layer of the Example was oriented in the (100) plane. More specifically, only the piezoelectric layer of the Example exhibited a diffraction spectrum in which the area intensity of the peak derived from $ABO_3$ structures observed in $20°<2\theta<25°$ is at least 90% that of the total area intensity of peaks derived from $ABO_3$ structures observed in $20°<2\theta<50°$; hence, the piezoelectric layer of the Example was oriented in the (100) plane. All the diffraction patterns of the Example and Comparative Examples 1 to 4 showed $ABO_3$ structure-derived diffraction peaks. This shows that the piezoelectric layers of the Example and Comparative Examples 1 to 4 have $ABO_3$ structures.

As shown in FIGS. 32 and 33, the piezoelectric layer of the Example exhibited a peak around $2\theta=46.1°$ representing a ferroelectric phase, and a peak around $2\theta=46.5°$ representing an antiferroelectric phase. This suggests that the piezoelectric layer of the Example is in a morphotropic phase boundary (MPB) including both structures derived from a ferroelectric and an antiferroelectric.

Experiment 6

Figure 34:
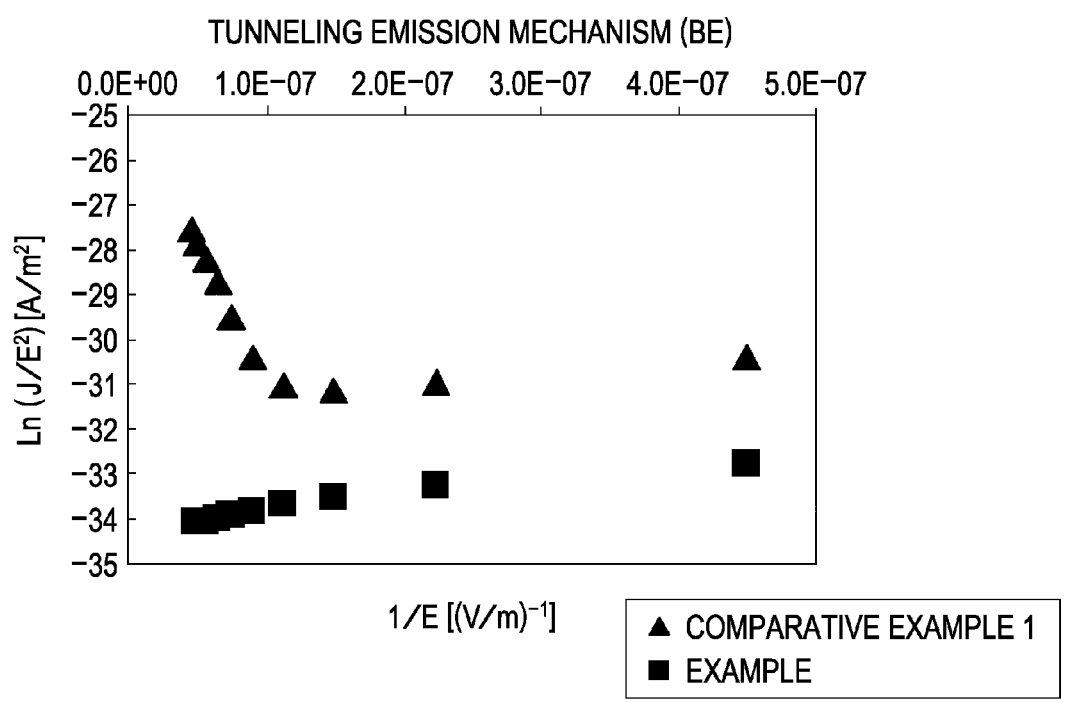
FIG. 34 is a plot showing tunnel emission mechanisms of the Example and Comparative Example 1.

The conduction mechanisms of the piezoelectric elements of the Example and Comparative Example 1 were examined from their current density-electric field (J-E) plots. FIG. 34 shows the results of tunnel emission mechanisms. These results show that the piezoelectric element of the Example, in which the crystallization was performed in a nitrogen atmosphere, hardly showed a tunnel current, and suggest that it can reduce leakage current. On the other hand, in Comparative Example 1, in which the crystallization was performed in an oxygen atmosphere, a tunnel current occurred at the higher electric field side. This is probably because the oxygen of the oxygen flow acted as a donor to cause a tunnel current.

Experiment 7

Figure 35:
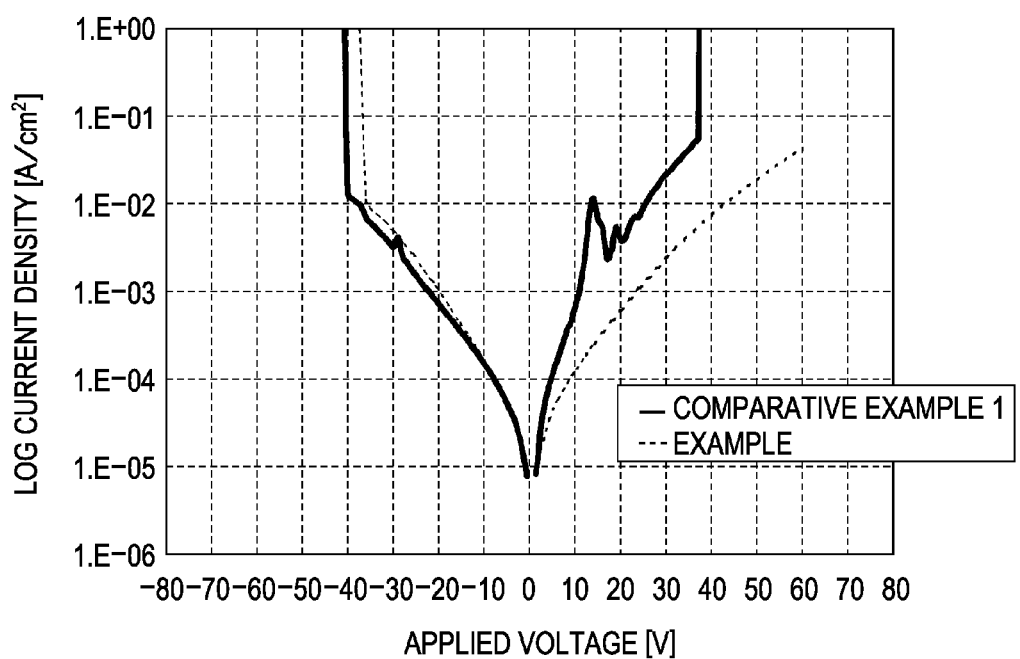
FIG. 35 is a plot of I-V curves of the Example and Comparative Example 1.

The relationships between the current density and the voltage (I-V curves) of the piezoelectric elements of the Example and Comparative Example 1 were obtained by applying voltages of ±60 V to the piezoelectric elements. The results are shown in FIG. 35. These results show that the piezoelectric element of the Example, in which the piezoelectric precursor film was crystallized by heating in a nitrogen atmosphere, had a higher insulation than that of Comparative Example 1, in which the crystallization was performed in an oxygen atmosphere, and that the withstand voltage can be also increased.

Other Embodiments

Although an exemplary embodiment of the invention has been described, the invention is not limited to the disclosed embodiment. Although the above embodiment has described a piezoelectric layer made of an $ABO_3$-type complex oxide having a fundamental composition containing metallic elements of only Bi, La, Fe and Mn, the piezoelectric layer may be made of any other $ABO_3$-type complex oxide and other metals may be added to adjust the characteristics, as long as it contains Bi, La, Fe and Mn.

Although, in the above embodiment, a monocrystalline silicon substrate is used as the flow channel substrate 10, the flow channel substrate 10 may be made of, for example, SOI or glass, without particular limitation.

Although the piezoelectric element 300 of the above embodiment includes the first electrode 60, the piezoelectric layer 70 and the second electrode 80 that are stacked in that order on a substrate (flow channel substrate 10), the structure of the piezoelectric element is not limited to this structure. For example, the invention can be applied to a vertical vibration piezoelectric element including layers of a piezoelectric material and an electrode material alternately formed so as to expand and contract in the axis direction.

Figure 36:
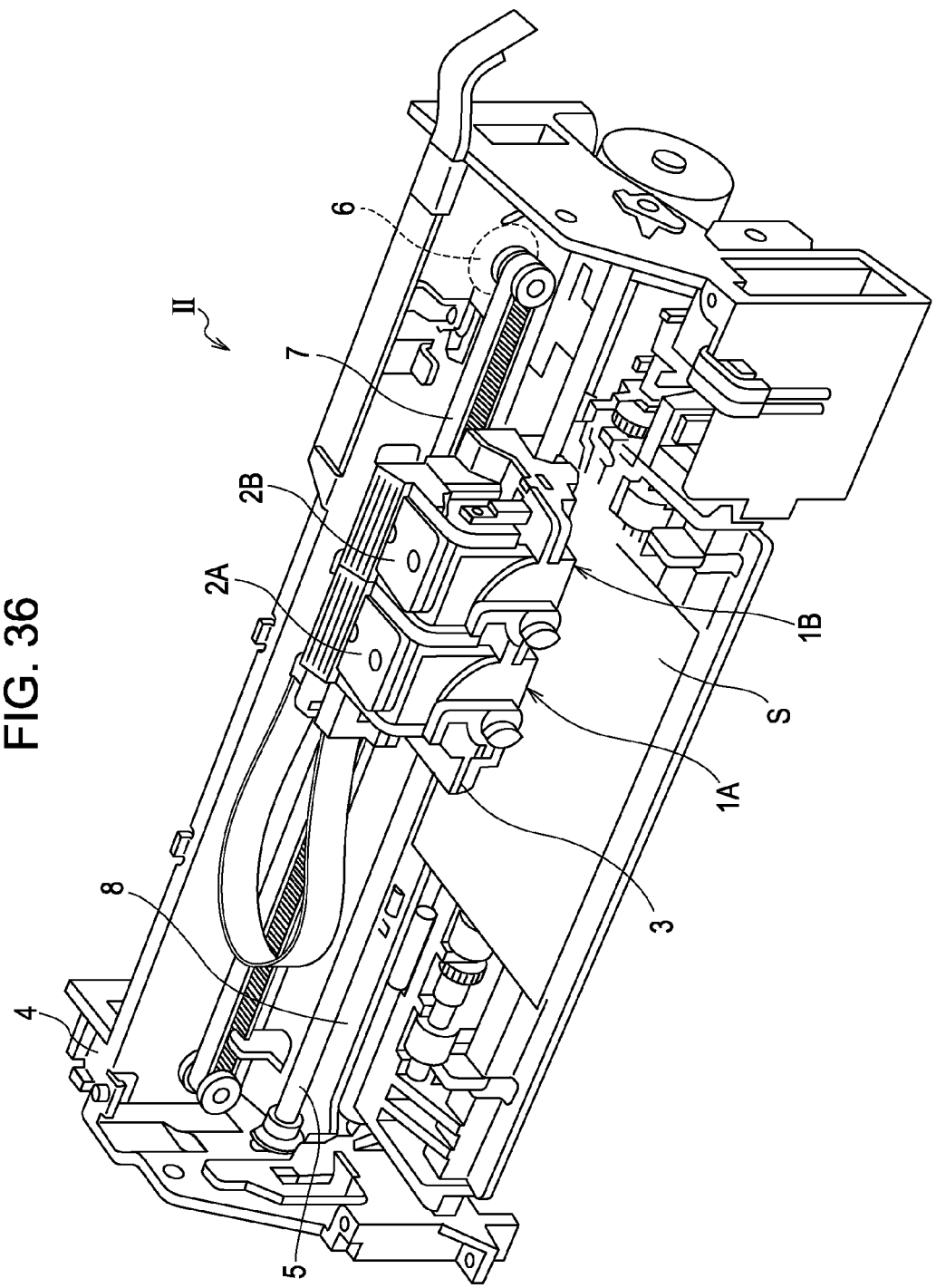
FIG. 36 is a schematic view of a recording apparatus according to an embodiment of the invention.

The ink jet recording head according to the embodiments of the invention is installed in an ink jet recording apparatus to serve as a part of a recording head unit including a flow channel communicating with an ink cartridge or the like. FIG. 36 is a schematic perspective view of an ink jet recording apparatus including the ink jet recording head.

The ink jet recording apparatus II shown in FIG. 36 includes recording head units 1A and 1B each including the ink jet recording head I, and cartridges 2A and 2B for supplying ink are mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting the driving force from a driving motor 6 to the carriage 3 through a plurality of gears (not shown) and a timing belt 7. In the apparatus body 4, a platen 8 is disposed along the carriage shaft 5 so that a recording sheet S being a print medium, such as paper, fed from a paper feed roller or the like (not shown) is transported over the platen 8.

Although the above embodiment has described an ink jet recording head as the liquid ejecting head, the invention is intended for any type of liquid ejecting head, and may be applied to other liquid ejecting heads ejecting liquid other than ink. Other liquid ejection heads include various types of recording head used in image recording apparatuses such as printers, color material ejecting heads used for manufacturing color filters of liquid crystal displays or the like, electrode material ejecting heads used for forming electrodes of organic EL displays or FEDs (field emission displays), and bioorganic material ejecting heads used for manufacturing biochips.

The piezoelectric element of the embodiments of the invention can be applied to ultrasonic wave devices such as ultrasonic oscillators and ultrasonic motors, pressure sensors, and other devices, without being limited to the piezoelectric element used in liquid ejecting heads represented by an ink jet recording head.

What is claimed is:

1. A method for manufacturing a piezoelectric element, comprising:
    forming a titanium film comprising titanium;
    forming a platinum film comprising platinum on the titanium film;
    forming a piezoelectric precursor film comprising bismuth, lanthanum, iron, and manganese on the platinum film;
    crystallizing the piezoelectric precursor film to form a piezoelectric layer by firing the piezoelectric precursor film in an atmosphere of an inert gas; and
    forming an electrode on the piezoelectric layer.

2. The method according to claim 1, wherein the inert gas is nitrogen.

3. A method for manufacturing a liquid ejecting head comprising a pressure generating chamber communicating with a nozzle aperture and a piezoelectric element allowing the pressure generating chamber to change pressure, the method comprising:
    forming a titanium film comprising titanium;
    forming a platinum film comprising platinum on the titanium film;

forming a piezoelectric precursor film comprising bismuth, lanthanum, iron, and manganese on the platinum film;

crystallizing the piezoelectric precursor film to form a piezoelectric layer by firing the piezoelectric precursor film in an atmosphere of an inert gas; and forming an electrode on the piezoelectric layer.

4. The method according to claim 3, wherein the inert gas is nitrogen.

5. A piezoelectric element comprising:

a first electrode including comprising:

a first titanium oxide layer comprising titanium oxide a platinum layer comprising platinum, formed above the first titanium oxide layer; and a second titanium oxide layer comprising titanium oxide, formed above the platinum layer;

a piezoelectric layer comprising bismuth, lanthanum, iron, and manganese, which is formed above the second titanium oxide layer; and a second electrode formed above the piezoelectric layer.

6. The piezoelectric element according to claim 5, wherein the piezoelectric layer comprises a complex oxide expressed by general formula (I):

$$(Bi_{1-x},La_x)(Fe_{1-y},Mn_y)O_3 \qquad (1)$$

wherein x and y satisfy the relationships $0.10 \leq x \leq 0.20$ and $0.01 \leq y \leq 0.09$.

7. The piezoelectric element according to claim 5, wherein the piezoelectric layer exhibits a powder X-ray diffraction pattern obtained at $\phi=\psi=0°$ in which the area intensity of the peak derived from $ABO_3$-type structures observed in $20°<2\theta<25°$ is at least 90% that of the total area intensity of peaks derived from $ABO_3$-type structures observed in $20°<2\theta<50°$.

8. A liquid ejecting head comprising the liquid ejecting head piezoelectric element according to claim 5.

9. A liquid ejecting apparatus comprising the liquid ejecting head according to claim 8.

* * * * *